(12) United States Patent
Chen et al.

(10) Patent No.: US 8,717,054 B2
(45) Date of Patent: May 6, 2014

(54) METHODS OF CREATING PROBE STRUCTURES FROM A PLURALITY OF PLANAR LAYERS

(75) Inventors: Richard T. Chen, Burbank, CA (US);
Ezekiel J. J. Kruglick, San Diego, CA (US); Christopher A. Bang, San Diego, CA (US); Dennis R. Smalley, Newhall, CA (US); Pavel B. Lembrikov, Santa Monica, CA (US)

(73) Assignee: Microfabrica Inc., Van Nuys, CA (US)

( * ) Notice: Subject to any disclaimer, the term of this patent is extended or adjusted under 35 U.S.C. 154(b) by 124 days.

(21) Appl. No.: 13/273,823

(22) Filed: Oct. 14, 2011

(65) Prior Publication Data
US 2012/0064226 A1 Mar. 15, 2012

Related U.S. Application Data

(63) Continuation of application No. 13/251,789, filed on Oct. 3, 2011, which is a continuation of application No. 13/025,511, filed on Feb. 11, 2011, now abandoned, which is a continuation of application No. 12/724,287, filed on Mar. 15, 2010, now abandoned, which is a continuation of application No. 11/695,597, filed on Apr. 2, 2007, now Pat. No. 7,679,388, which is a continuation of application No. 11/028,960, filed on Jan. 3, 2005, now Pat. No. 7,265,565, which is a continuation-in-part of application No. 10/949,738, filed on Sep. 24, 2004, now abandoned, said application No. 10/949,738 is a continuation-in-part of application No. 10/772,943, filed on Feb. 4, 2004, now abandoned.

(60) Provisional application No. 60/582,689, filed on Jun. 23, 2004, provisional application No. 60/582,690, filed on Jun. 23, 2004, provisional application No. 60/609,719, filed on Sep. 13, 2004, provisional application No. 60/611,789, filed on Sep. 20, 2004, provisional application No. 60/540,511, filed on Jan. 29, 2004, provisional application No. 60/533,933, filed on Dec. 31, 2003, provisional application No. 60/536,865, filed on Jan. 15, 2004, provisional application No. 60/533,947, filed on Dec. 31, 2003, provisional application No. 60/506,015, filed on Sep. 24, 2003, provisional application No. 60/445,186, filed on Feb. 4, 2003.

(51) Int. Cl.
*G01R 31/00* (2006.01)

(52) U.S. Cl.
USPC ............. 324/755.05; 324/755.07; 324/755.11

(58) Field of Classification Search
None
See application file for complete search history.

(56) References Cited

U.S. PATENT DOCUMENTS 3,832,632 A 8/1974 Ardezzone
4,952,272 A 8/1990 Okino et al.

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner* — Minh N Tang
(74) *Attorney, Agent, or Firm* — Dennis R. Smalley

(57) ABSTRACT

Embodiments disclosed herein are directed to compliant probe structures for making temporary or permanent contact with electronic circuits and the like. Some embodiments are directed to various designs of cantilever-like probe structures while other embodiments are directed to methods for fabricating probe structures. In some embodiments, methods of forming probe structures include formation of a plurality of planar multi-material electrodeposited layers wherein each probe structure includes a contact tip and a compliant body, wherein the compliant body is formed from at least one material that is different from the contact tip material and wherein the compliant body provides for elastic compression of the probe in a plane of primary motion during use and wherein during formation of the layers a stacking direction of the plurality of layers is perpendicular to the plane of primary motion.

18 Claims, 37 Drawing Sheets

(56) References Cited

U.S. PATENT DOCUMENTS

| | | | |
|---|---|---|---|
| 4,955,523 A | 9/1990 | Carlommagno et al. |
| 4,961,052 A | 10/1990 | Tada et al. |
| 5,020,219 A | 6/1991 | Leedy |
| 5,070,297 A | 12/1991 | Kwon et al. |
| 5,177,438 A | 1/1993 | Littlebury et al. |
| 5,189,507 A | 2/1993 | Carlomagno et al. |
| 5,190,637 A | 3/1993 | Guckel |
| 5,286,208 A | 2/1994 | Matsuoka |
| 5,297,967 A | 3/1994 | Baumberger et al. |
| 5,354,712 A | 10/1994 | Ho et al. |
| 5,476,211 A | 12/1995 | Khandros |
| 5,476,818 A | 12/1995 | Yanof et al. |
| 5,513,430 A | 5/1996 | Yanof et al. |
| 5,545,045 A | 8/1996 | Wakamatsu |
| 5,578,185 A | 11/1996 | Bergeron et al. |
| 5,599,194 A | 2/1997 | Ozawa et al. |
| 5,722,861 A | 3/1998 | Wetter |
| 5,772,451 A | 6/1998 | Dozier, II et al. |
| 5,806,181 A | 9/1998 | Khandros et al. |
| 5,811,982 A | 9/1998 | Beaman et al. |
| 5,820,014 A | 10/1998 | Dozier, II et al. |
| 5,829,128 A | 11/1998 | Eldridge et al. |
| 5,864,946 A | 2/1999 | Eldridge et al. |
| 5,892,223 A | 4/1999 | Karpov et al. |
| 5,917,707 A | 6/1999 | Khandros et al. |
| 5,923,637 A | 7/1999 | Shimada et al. |
| 5,970,610 A | 10/1999 | Yumikura et al. |
| 5,974,662 A | 11/1999 | Eldridge et al. |
| 5,994,152 A | 11/1999 | Khandros et al. |
| 6,023,103 A | 2/2000 | Chang et al. |
| 6,027,630 A | 2/2000 | Cohen |
| 6,043,563 A | 3/2000 | Eldridge et al. |
| 6,044,548 A | 4/2000 | Distefano et al. |
| 6,064,213 A | 5/2000 | Khandros et al. |
| 6,184,053 B1 | 2/2001 | Eldridge et al. |
| 6,208,225 B1 | 3/2001 | Miller |
| 6,218,910 B1 | 4/2001 | Miller |
| 6,255,126 B1 | 7/2001 | Mathieu et al. |
| 6,256,882 B1 | 7/2001 | Gleason et al. |
| 6,264,477 B1 | 7/2001 | Smith et al. |
| 6,268,015 B1 | 7/2001 | Mathieu et al. |
| 6,278,284 B1 | 8/2001 | Mori et al. |
| 6,336,269 B1 | 1/2002 | Eldridge et al. |
| 6,344,752 B1 | 2/2002 | Hagihara et al. |
| 6,426,638 B1 | 7/2002 | Di Stefano |
| 6,441,315 B1 | 8/2002 | Eldridge et al. |
| 6,456,099 B1 | 9/2002 | Eldridge et al. |
| 6,471,538 B2 | 10/2002 | Zhou et al. |
| 6,482,013 B2 | 11/2002 | Eldridge et al. |
| 6,483,328 B1 | 11/2002 | Eldridge et al. |
| 6,491,968 B1 | 12/2002 | Mathieu et al. |
| 6,499,216 B1 | 12/2002 | Fjelstad |
| 6,509,751 B1 | 1/2003 | Mathieu et al. |
| 6,520,778 B1 | 2/2003 | Eldridge et al. |
| 6,539,531 B2 | 3/2003 | Miller et al. |
| 6,560,861 B2 | 5/2003 | Fork et al. |
| 6,624,648 B2 | 9/2003 | Eldridge et al. |
| 6,627,483 B2 | 9/2003 | Ondricek et al. |
| 6,640,415 B2 | 11/2003 | Eslamy et al. |
| 6,651,325 B2 | 11/2003 | Lee et al. |
| 6,672,875 B1 | 1/2004 | Mathieu et al. |
| 6,676,438 B2 | 1/2004 | Zhou et al. |
| 6,690,185 B1 | 2/2004 | Khandros et al. |
| 6,690,186 B2 | 2/2004 | Fjelstad |
| 6,692,145 B2 | 2/2004 | Gianchandani et al. |
| 6,705,876 B2 | 3/2004 | Eldridge |
| 6,713,374 B2 | 3/2004 | Eldridge et al. |
| 6,729,019 B2 | 5/2004 | Grube et al. |
| 6,771,084 B2 | 8/2004 | Di Stefano |
| 6,777,319 B2 | 8/2004 | Grube et al. |
| 6,788,086 B2 | 9/2004 | Hantschel et al. |
| 6,794,890 B1 | 9/2004 | Tokumo et al. |
| 6,811,406 B2 | 11/2004 | Grube |
| 6,817,052 B2 | 11/2004 | Grube |
| 6,838,893 B2 | 1/2005 | Khandros, Jr. et al. |
| 6,856,156 B2 | 2/2005 | Liang et al. |
| 6,888,362 B2 * | 5/2005 | Eldridge et al. .......... 324/754.07 |
| 6,913,468 B2 | 7/2005 | Dozier, II et al. |
| 6,945,827 B2 | 9/2005 | Grube et al. |
| 6,948,940 B2 | 9/2005 | Lindsey et al. |
| 6,967,493 B2 | 11/2005 | Mori et al. |
| 7,024,763 B2 | 4/2006 | Mathieu et al. |
| 7,047,638 B2 | 5/2006 | Eldridge et al. |
| 7,086,149 B2 | 8/2006 | Eldridge et al. |
| 7,126,220 B2 | 10/2006 | Lahiri et al. |
| 7,142,000 B2 | 11/2006 | Eldridge et al. |
| 7,252,861 B2 | 8/2007 | Smalley |
| 7,265,565 B2 | 9/2007 | Chen et al. |
| 7,271,888 B2 | 9/2007 | Frodis et al. |
| 7,287,322 B2 | 10/2007 | Mathieu et al. |
| 7,326,327 B2 | 2/2008 | Armstrong et al. |
| 7,363,705 B2 | 4/2008 | Kim et al. |
| 7,557,595 B2 | 7/2009 | Chen et al. |
| 7,679,388 B2 | 3/2010 | Chen et al. |
| 2002/0017915 A1 | 2/2002 | Kamiya |
| 2002/0053734 A1 | 5/2002 | Eldridge et al. |
| 2002/0196038 A1 | 12/2002 | Okuno et al. |
| 2003/0186405 A1 | 10/2003 | Lee et al. |
| 2004/0072452 A1 | 4/2004 | Eldridge et al. |
| 2005/0029225 A1 | 2/2005 | Zhang |
| 2005/0045585 A1 | 3/2005 | Zhang et al. |
| 2005/0184748 A1 | 8/2005 | Chen et al. |
| 2006/0006888 A1 | 1/2006 | Kruglick et al. |
| 2007/0144841 A1 | 6/2007 | Chong et al. |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

"Microfabrication—Rapid Prototyping's Killer Application", Rapid Prototyping Report, CAD/CAM Publishing, Inc., Jun. 1999, pp. 1-5.

* cited by examiner

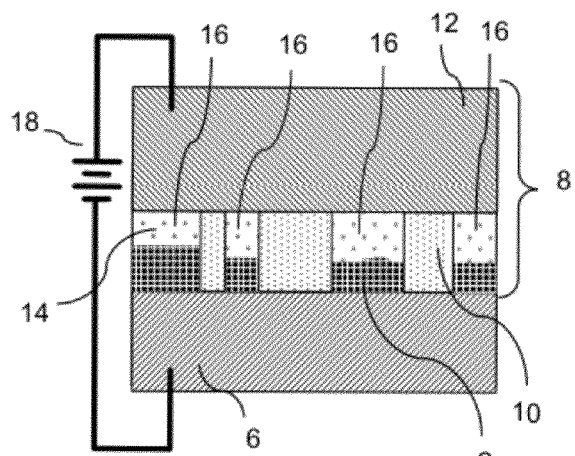
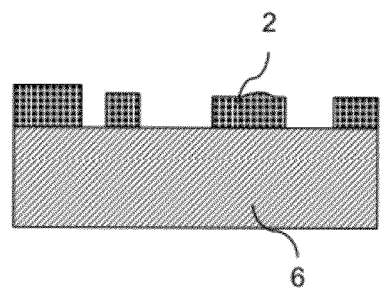
FIG. 2A (PRIOR ART)
FIG. 2B (PRIOR ART)
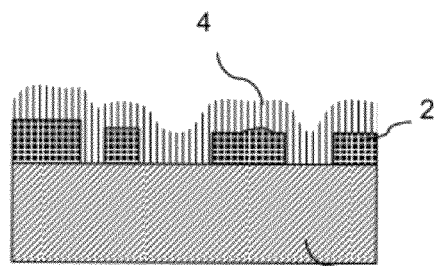
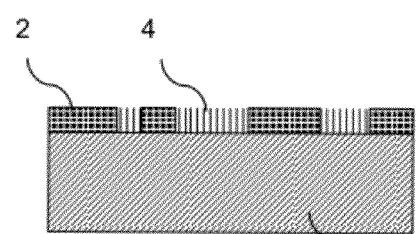
FIG. 2C (PRIOR ART)
FIG. 2D (PRIOR ART)
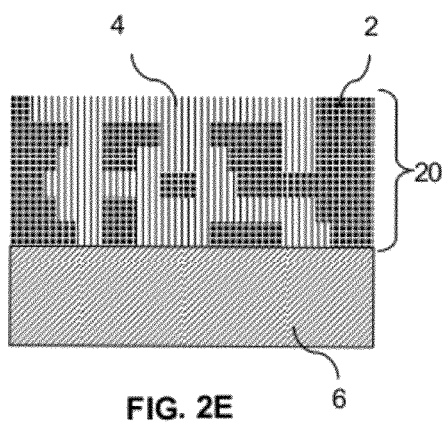
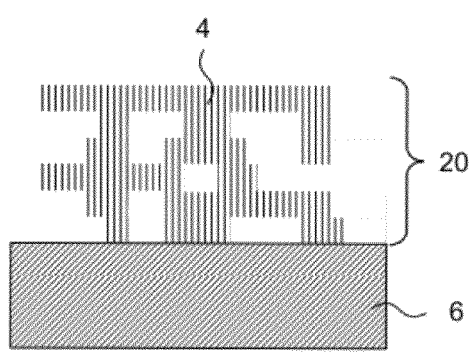
FIG. 2E (PRIOR ART)
FIG. 2F (PRIOR ART)

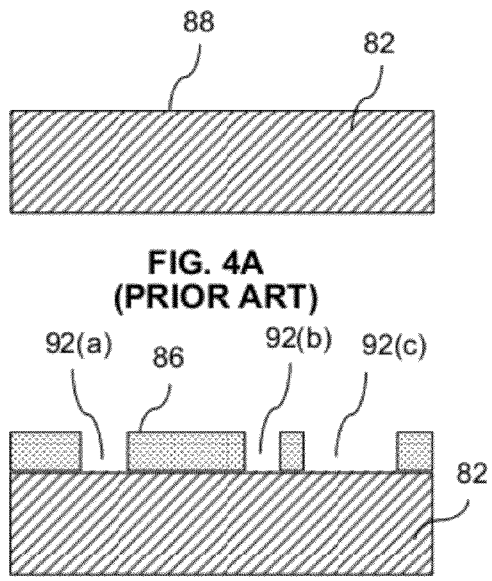
FIG. 4A (PRIOR ART)
FIG. 4C (PRIOR ART)
FIG. 4E (PRIOR ART)
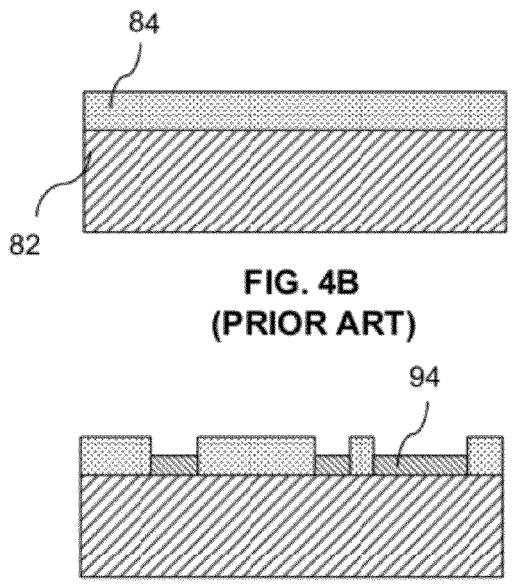
FIG. 4B (PRIOR ART)
FIG. 4D (PRIOR ART)
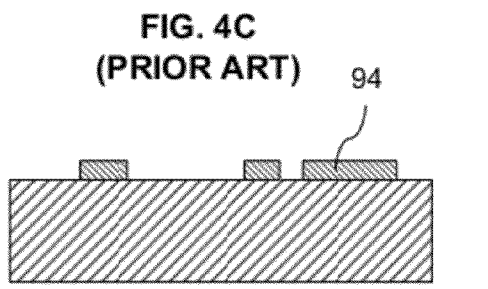
FIG. 4G (PRIOR ART)
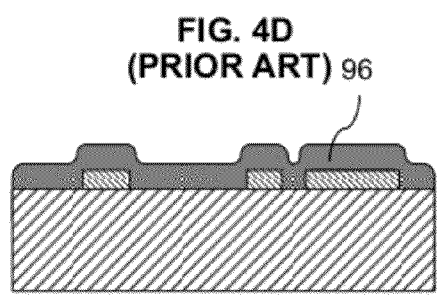
FIG. 4F (PRIOR ART)
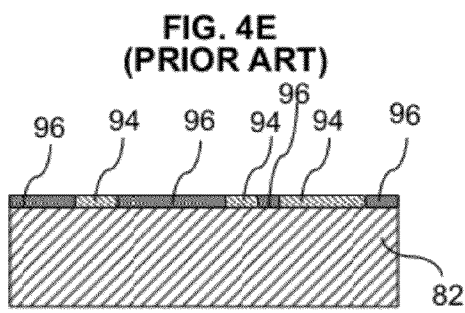
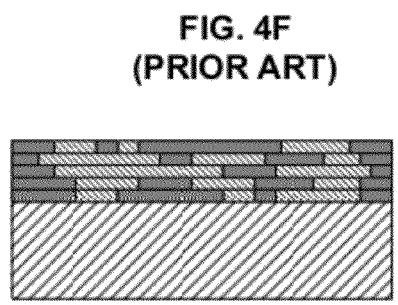
FIG. 4H (PRIOR ART)
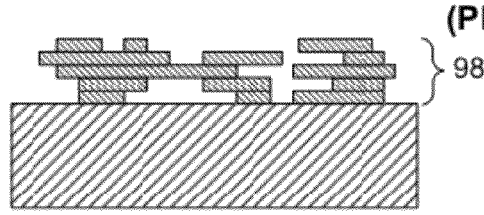
FIG. 4I (PRIOR ART)

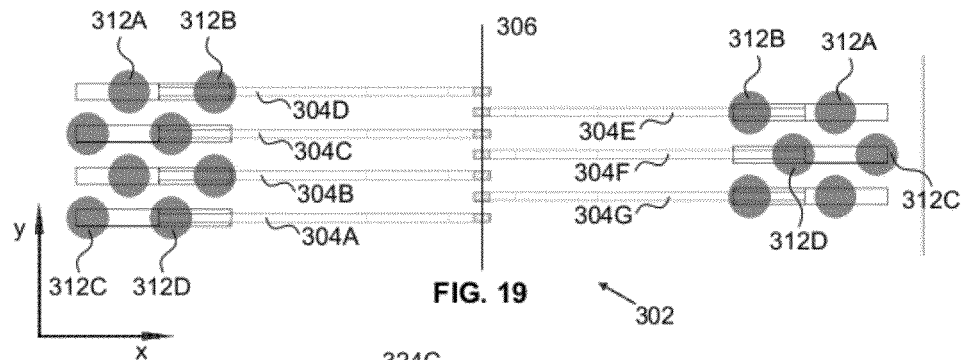
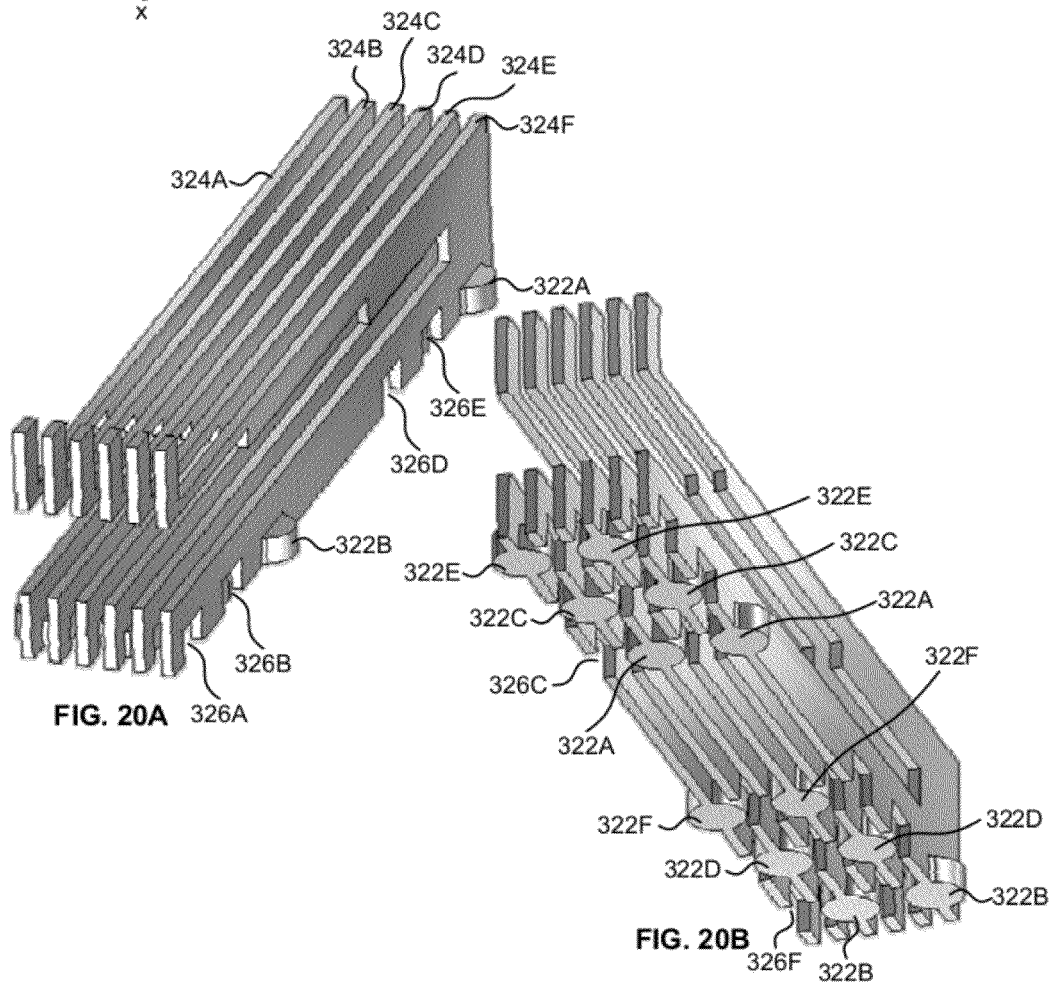

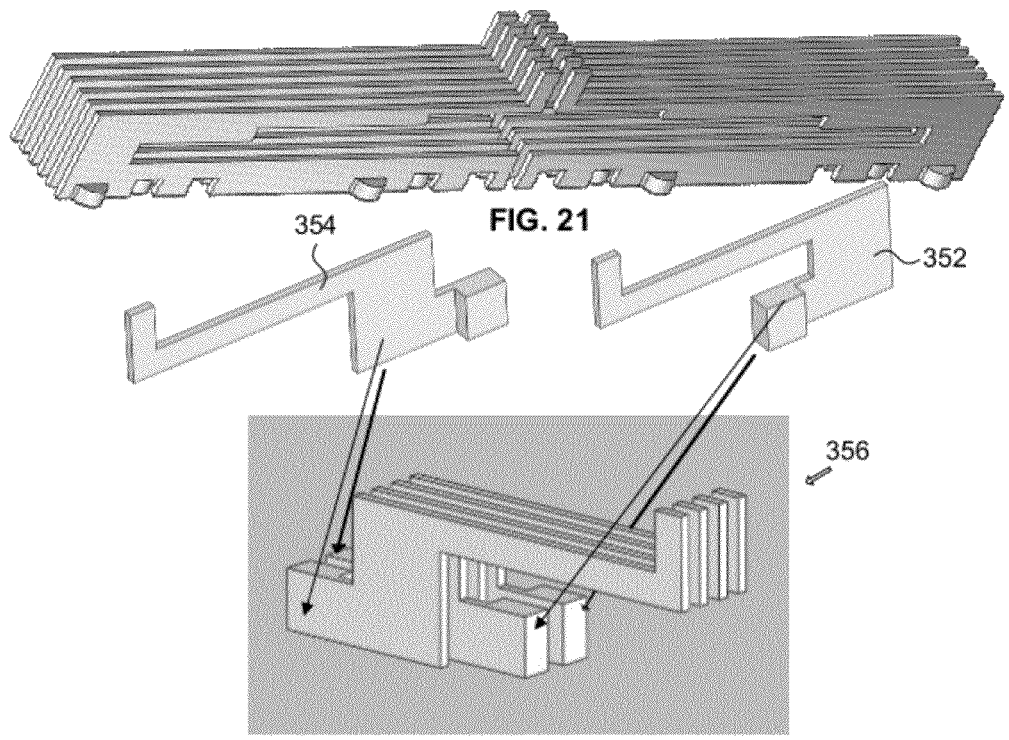
FIG. 21
FIG. 22A
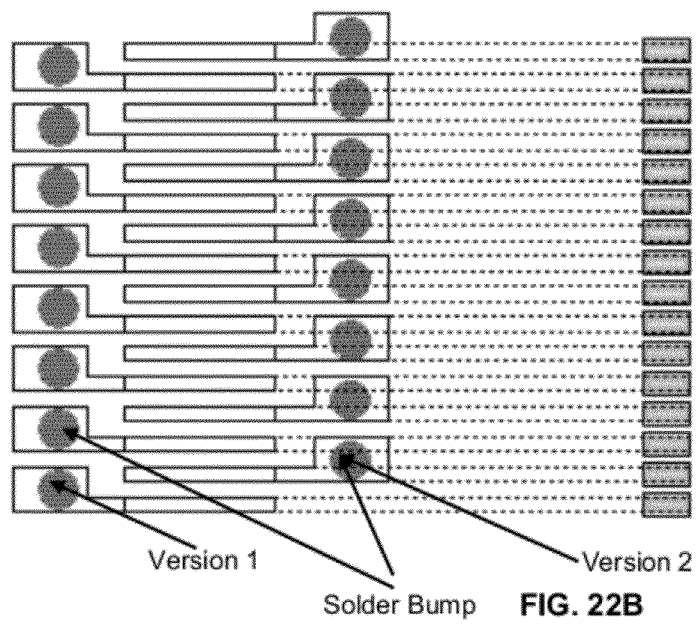
Version 1   Version 2
   Solder Bump   FIG. 22B

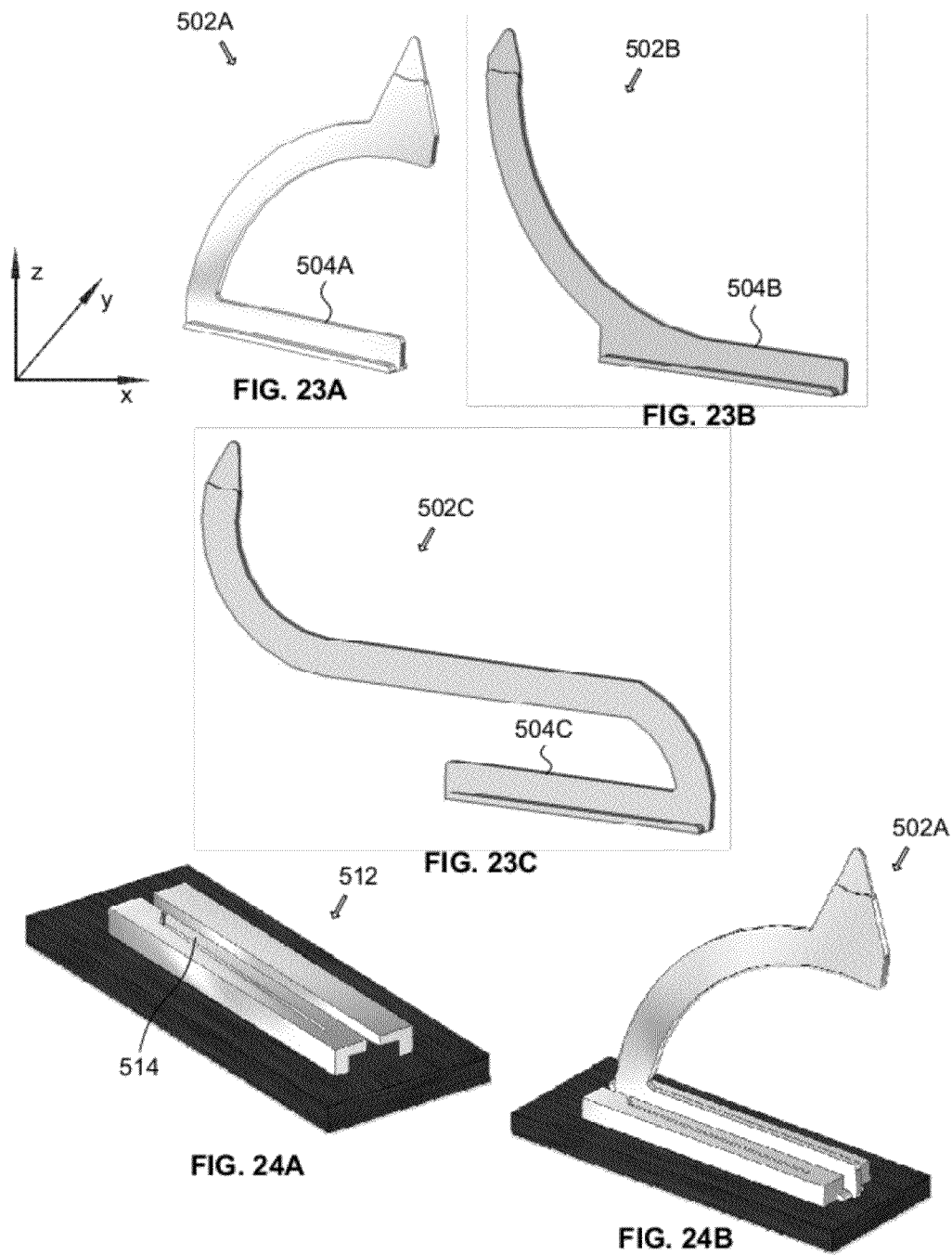

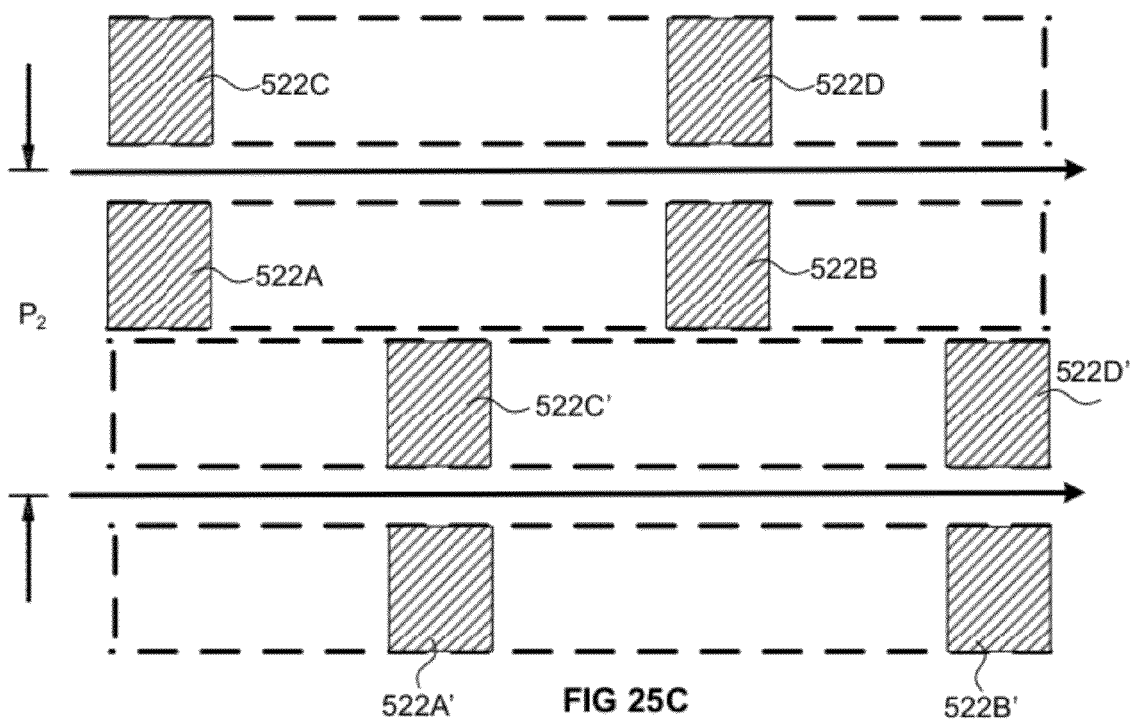

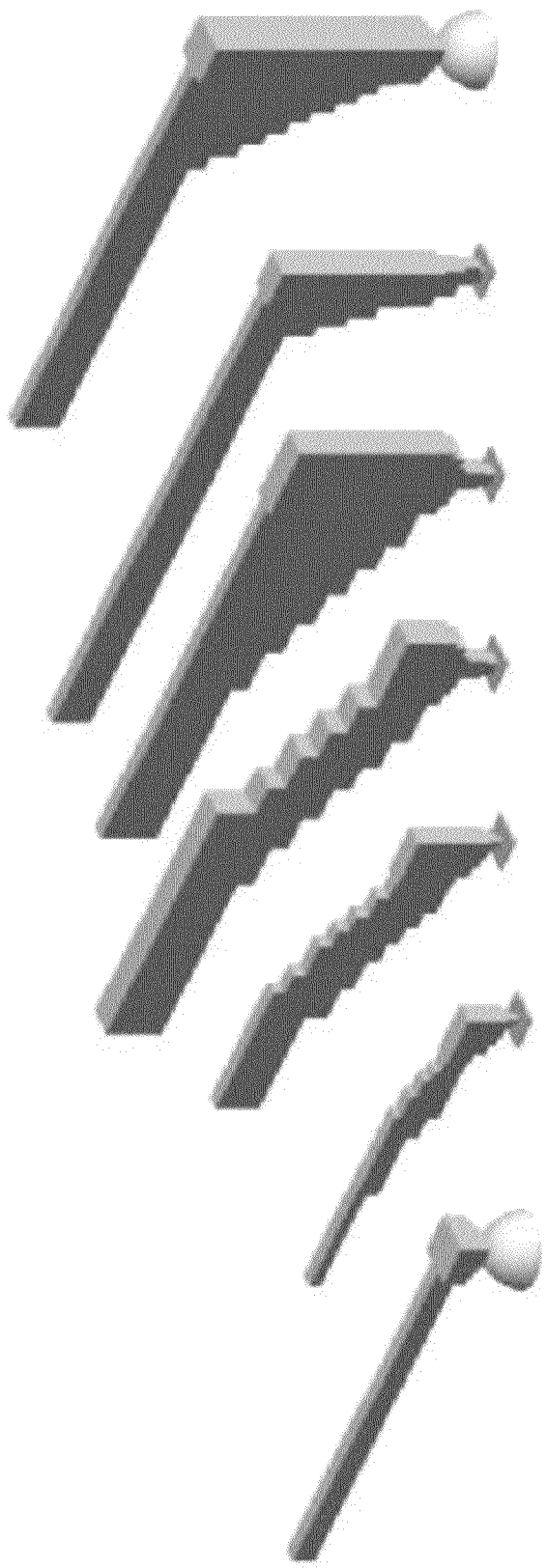

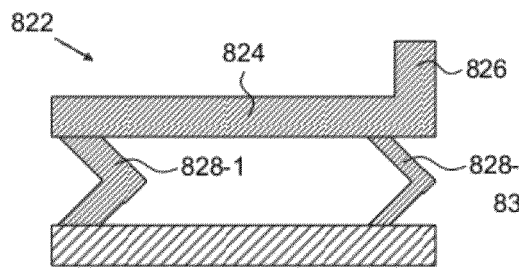
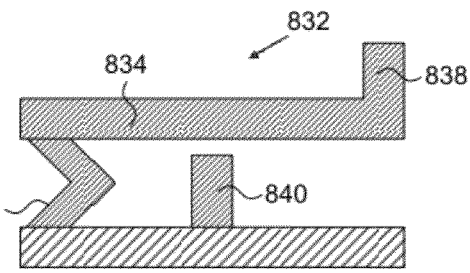
FIG. 42A  FIG. 42B
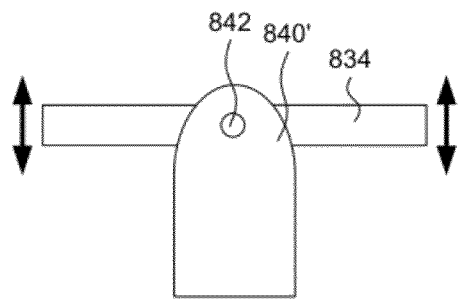
FIG. 43A
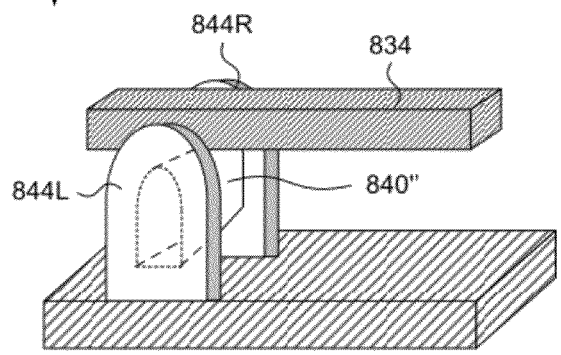
FIG. 43B
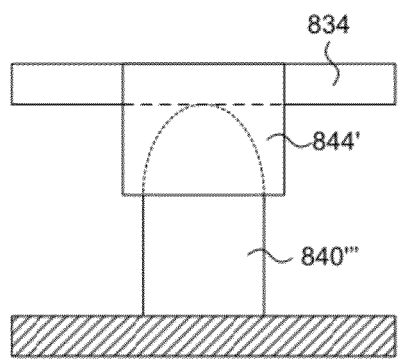
FIG 43C

METHODS OF CREATING PROBE STRUCTURES FROM A PLURALITY OF PLANAR LAYERS

RELATED APPLICATIONS

This application is a continuation of U.S. patent application Ser. No. 13/251,789, filed Oct. 3, 2011. The '789 application is a continuation of U.S. application Ser. No. 13/025,511, filed Feb. 11, 2011, now abandoned. The '511 application is a continuation of U.S. application Ser. No. 12/724,287, filed Mar. 15, 2010, now abandoned. The '287 application is a continuation of U.S. application Ser. No. 11/695,597, filed Apr. 2, 2007, now U.S. Pat. No. 7,679,388. The '597 application is a continuation of U.S. patent application Ser. No. 11/028,960, filed on Jan. 3, 2005, now U.S. Pat. No. 7,265,565. The '960 application is a continuation-in-part of U.S. patent application Ser. No. 10/949,738, filed Sept. 24, 2004, now abandoned and the '960 application also claims benefit of U.S. application Nos. 60/582,689, filed Jun. 23, 2004; 60/582,690, filed Jun. 23, 2004; 60/609,719, filed Sept. 13, 2004; 60/611,789, filed Sept. 20, 2004; 60/540,511, filed Jan. 29, 2004; 60/533,933, filed Dec. 31, 2003; 60/536,865, filed Jan. 15, 2004; and 60/533,947, Dec. 31, 2003. The '738 application is a continuation-in-part of U.S. patent application Ser. No. 10/772,943, filed Feb. 4, 2004, now abandoned, and the '738 application also claims benefit of U.S. application Nos.: 60/506,015, filed Sept. 24, 2003; 60/533,933, filed Dec. 31, 2003; and 60/536,865, filed Jan. 15, 2004. The '943 application claims benefit of U.S. application Nos. 60/445,186, filed Feb. 4, 2003; 60/506,015, filed Sept. 24, 2003; 60/533,933, filed Dec. 31, 2003; and 60/536,865, filed Jan. 15, 2004. Each of these applications is incorporated herein by reference as if set forth in full herein including any appendices attached thereto.

FIELD OF THE INVENTION

Embodiments of the present invention relate to microprobes (e.g. for use in the wafer level testing of integrated circuits, such as memory or logic devices), and more particularly relate to cantilever microprobes. In some embodiments, microprobes are fabricated using electrochemical fabrication methods (e.g. EFAB® fabrication processes).

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It has been commercially pursued by Microfabrica® Inc. of Van Nuys, California under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica® Inc. of Van Nuys, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING™) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

3. A. Cohen, "3-D Micromachining by Electrochemical Fabrication", Micromachine Devices, March 1999.

4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroN\anotechnology for Space Applications, The Aerospace Co., April 1999.

5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

8. A. Cohen, "Electrochemical Fabrication (EFABTM)", Chapter 19 of The MEMS Handbook, edited by Mohamed Gad-El-Hak, CRC Press, 2002.

9. Microfabrication-Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating, as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical fabrication provides the ability to form prototypes and commercial quantities of miniature objects, parts, structures, devices, and the like at reasonable costs and in reasonable times. In fact, electrochemical fabrication is an enabler for the formation of many structures that were hitherto impossible to produce. Electrochemical fabrication opens the spectrum for new designs and products in many industrial fields. Even though electrochemical fabrication offers this new capability and it is understood that electrochemical fabrication techniques can be combined with designs and structures known within various fields to produce new structures, certain uses for electrochemical fabrication provide designs, structures, capabilities and/or features not known or obvious in view of the state of the art.

A need exists in various fields for miniature devices having improved characteristics, reduced fabrication times, reduced fabrication costs, simplified fabrication processes, and/or more independence between geometric configuration and the selected fabrication process. A need also exists in the field of miniature device fabrication for improved fabrication methods and apparatus.

SUMMARY OF THE INVENTION

It is an object of some embodiments of the invention to provide cantilever probes with improved characteristics.

It is an object of some embodiments of the invention to provide cantilever probes that are more reliable.

It is an object some embodiments of the invention to provide improved methods for fabricating cantilever probes.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively they may address some other object of the invention ascertained from the teachings herein. It is not necessarily intended that all objects be addressed by any single aspect of the invention even though that may be the case with regard to some aspects.

In a first aspect of the invention a cantilever probe for making contact with an electronic circuit element includes: at least one base element which is bonded to a substrate; a support element which extends from a portion of the base element; a cantilever portion which has a proximal and distal end, wherein the proximal end contacts the support element, and wherein a footprint of the at least one base element underlies at least a portion of the cantilever portion; and a tip portion which is located at or near a distal end of the cantilever portion which may be used to make electrical contact with a pad on an electronic circuit element.

In a second aspect of the invention a cantilever probe for making contact with an electronic circuit element includes: at least one base element which is bonded to a substrate; a support element which extends from a portion of the base element; a cantilever portion which has a proximal and distal end, wherein the proximal end contacts the support element, and wherein a footprint of the at least one base element underlies at least 25% of the cantilever portion; and a tip portion which is located at or near a distal end of the cantilever portion which may be used to make electrical contact with a pad.

In a third aspect of the invention a cantilever probe for making contact with an electronic circuit element includes: at least one base element which is bonded to a substrate; a support element which extends from a portion of the base element; a cantilever portion which has a proximal and distal end, wherein the proximal end contacts the support element, and wherein a footprint of the at least one base element underlies at least 50% of the cantilever portion; and a tip portion which is located at or near a distal end of the cantilever portion which may be used to make electrical contact with a pad.

In a fourth aspect of the invention a cantilever probe for making contact with an electronic circuit element includes: at least one base element which is bonded to a substrate; a support element which extends from a portion of the base element; a cantilever portion which has a proximal and distal end, wherein the proximal end contacts the support element, and wherein a footprint of the at least one base element underlies at least 75% of the cantilever portion; and a tip portion which is located at or near a distal end of the cantilever portion which may be used to make electrical contact with a pad.

In a fifth aspect of the invention an array of cantilever probes for making contact with an electronic circuit element includes a plurality of cantilever probes positioned relative to each other wherein interlaced bonding locations are used on adjacent probes.

In a sixth aspect of the invention a probe assembly for making electric contact with an electronic circuit element includes: a substrate including at least one structure; at least one probe including: a contact tip portion; a compliant portion functionally attached to the tip portion; and a base portion functionally attached to the compliant portion, wherein the base portion is configured to mate with and be at least partially mechanically constrained by its physical configuration and the physical configuration of the at least one structure on the substrate.

In a seventh aspect of the invention a probe device for testing integrated circuits includes: at least one post element; a composite beam element, including at least two partially independent beams attached to the at least one post element; and a contact element attached to the composite beam element.

In an eighth aspect of the invention a probe device for testing integrated circuits includes: at least one post element having a first end connected to a substrate; a beam element connecting the post element to a contact tip element; at least one secondary beam element having one end connected to a contact tip element and a second end; at least one bridge element connected to the second end of the secondary beam structure; at least one tertiary beam element having a first end connected to the bridging element and having a second end; at least one secondary post element connected to the substrate and to the tertiary beam.

In a ninth aspect of the invention a cantilever probe for making contact with an electronic circuit element includes: at least one pivot element which is bonded to a substrate; at least one beam element having a contact tip attached thereto and positioned to pivot about the pivot element; a compliant element that functionally connects a substrate to the beam element on a side of the beam that is opposite to that of the contact tip; wherein the compliant element experiences a net tension force as the contact tip is pressed against a target surface.

In a tenth aspect of the invention a cantilever probe for making contact with an electronic circuit element includes: at least one pivot element which is bonded to a substrate; at least one beam element having a contact tip attached thereto and positioned to pivot about the pivot element; a compliant element that functionally connects a substrate to the beam element on a same side of the beam which holds the contact tip; wherein the compliant element experiences a net compressive force as the contact tip is pressed against a target surface.

In an eleventh aspect of the invention a cantilever probe for making contact with an electronic circuit element includes: a support element; a cantilever portion which has a first and second region, wherein the first region contacts the support element; and a contact tip held by the cantilever portion at the second region, wherein the cantilever portion has a shape which is narrower toward the second region than the first region.

In a twelfth aspect of the invention a cantilever probe for making contact with an electronic circuit element includes: at least one base element which is bonded to a substrate; a support element which extends from a portion of the base element; a cantilever portion which has a first region and a second region, wherein the first region contacts the support element, and wherein a footprint of the at least one base element underlies at least a portion of the cantilever portion; and a tip portion which is held by the cantilever portion at the second region which may be used to make electrical contact with a pad on an electronic circuit element.

In a thirteenth aspect of the invention a method for forming a cantilever probe includes: (A) providing a build substrate; (B) forming a plurality of deposited planarized layers of material on the substrate according to a design of the cantilever probe; and (C) releasing the cantilever probe from any sacrificial material used in forming the plurality of layers and from the build substrate.

In a fourteenth aspect of the invention a method for forming a cantilever probe includes: (A) providing a substrate; (B) forming a plurality of deposited planarized layers of material on the substrate according to a design of the cantilever probe; and (C) releasing the cantilever probe from any sacrificial material used in forming the plurality of layers.

Further aspects of the invention will be understood by those of skill in the art upon reviewing the teachings herein. Other aspects of the invention may involve apparatus and methods used in implementing the above noted aspects of the invention. These other aspects of the invention may provide various combinations of the aspects, embodiments, and associated alternatives explicitly set forth herein as well as provide other configurations, structures, functional relationships, and processes that have not been specifically set forth above.

BRIEF DESCRIPTION OF THE DRAWINGS

FIGS. 2A-2F schematically depict side views of various stages of an electrochemical fabrication process as applied to the formation of a particular structure where a sacrificial material is selectively deposited while a structural material is blanket deposited.

FIGS. 4A-4F schematically depict the formation of a first layer of a structure using adhered mask plating where the blanket deposition of a second material overlays both the openings between deposition locations of a first material and the first material itself.

FIG. 4G depicts the completion of formation of the first layer resulting from planarizing the deposited materials to a desired level.

FIGS. 4H and 4I respectively depict the state of the process after formation of the multiple layers of the structure and after release of the structure from the sacrificial material.

FIG. 19 depicts a top view of a probe array having seven cantilever probe elements which form a linear contact pattern and which have been spaced with a desired resolution by (1) having each adjacent contact point accessed from opposite sides of the contact line and by using bonding locations that are offset between adjacent probes.

FIGS. 20A and 20B show perspective views from the top and bottom, respectively, of a six probe array where all probes extend from the same side of a contact line and where bonding region interlacing is used to allow the probes to be located closer together than would be allowed without the interlacing.

FIG. 21 shows a perspective view of two sets of six element probe arrays that form two contact lines and which have the same interlacing and bonding location compensation openings as noted with regard to FIGS. 20A and 20B.

FIGS. 22A and 22B depict perspective and top views, respectively, of probes and probe arrays that use different probe designs and bonding regions for adjacent probes to allow tighter pitch to be used.

FIGS. 23A-23C depict perspective views of cantilever structures having base elements with "L" shaped structures that can slide into and interlock with appropriate base structures affixed to or forming part of a substrate.

FIG. 24A depicts a slotted mounting structure on a substrate into which a probe with an "L" or "T" shaped base may be inserted while FIG. 24B depicts a perspective view of such a probe slid into the slotted mounting structure.

FIG. 25A depicts an alternative mounting structure configuration while FIGS. 25B and 25C depict two alternative configurations for locating the mounting structures in forming arrays of various pitch.

FIGS. 39D-39J provide perspective views of various cantilever probe structures according to some embodiments of the invention.

FIG. 42A provides a side view of a sample cantilever probe structure having two compliant support structures.

FIG. 42B provides a side view of a sample tensional cantilever probe structure.

FIGS. 43A-43C provide two side views (43A and 43C) and a perspective view (43B) of various possible mechanical configurations of pivot structures and cantilever beams.

DETAILED DESCRIPTION OF PREFERRED EMBODIMENTS OF THE INVENTION

Figure 1A:
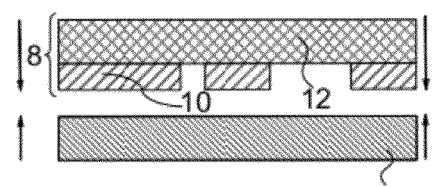
FIGS. 1A-1C schematically depict side views of various stages of a CC mask plating process, while FIGS. 1D-1G schematically depict a side views of various stages of a CC mask plating process using a different type of CC mask.
Figure 1B:
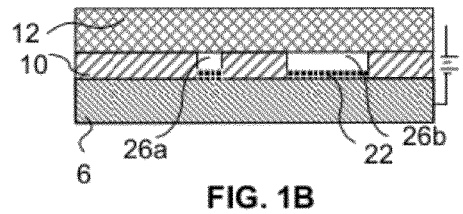
Figure 1C:
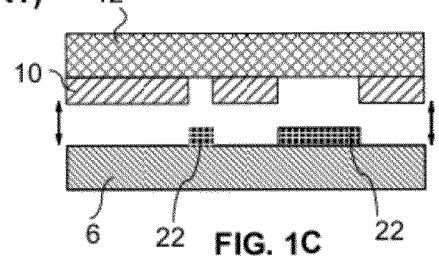
Figure 1D:
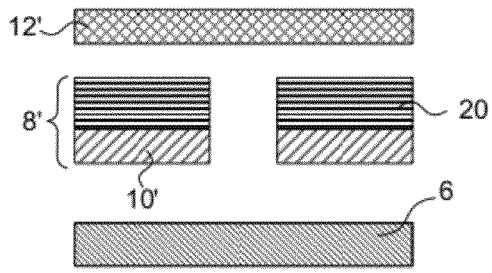
Figure 1E:
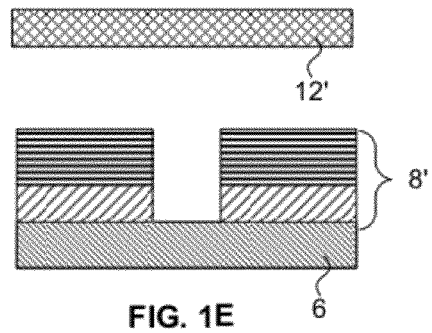
Figure 1F:
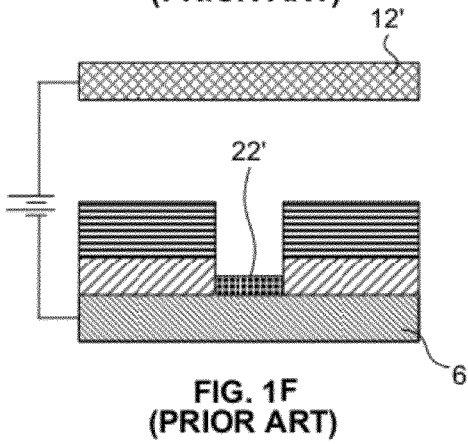
Figure 1G:
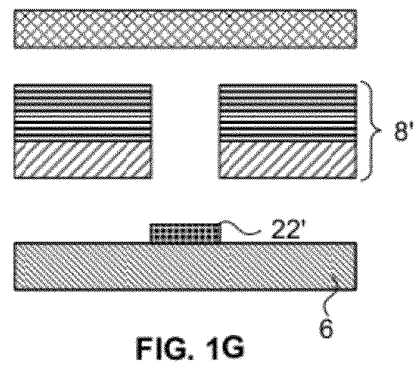
Figure 3A:
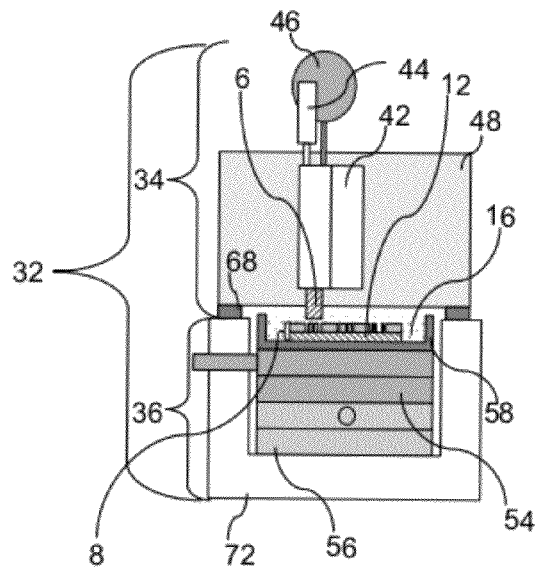
FIGS. 3A-3C schematically depict side views of various example apparatus subassemblies that may be used in manually implementing the electrochemical fabrication method depicted in FIGS. 2A-2F.
Figure 3B:
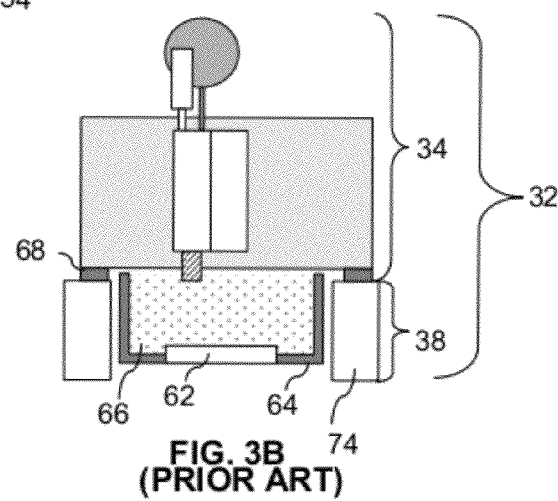
Figure 3C:
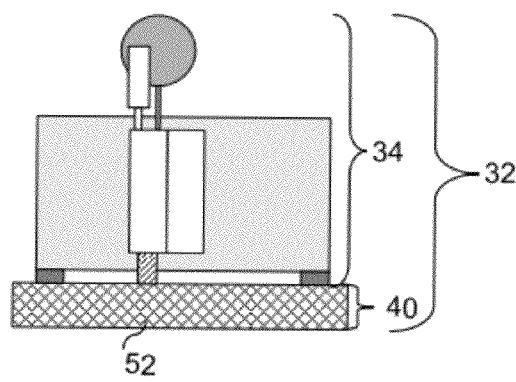

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments or various aspects of the invention to yield enhanced embodiments. Still other embodiments may be derived from combinations of the various embodiments explicitly set forth herein.

FIGS. 4A-4G illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer.

In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. a component or device).

The various embodiments, alternatives, and techniques disclosed herein may be combined with or be implemented via electrochemical fabrication techniques. Such combinations or implementations may be used to form multi-layer structures using a single patterning technique on all layers or using different patterning techniques on different layers. For example, different types of patterning masks and masking techniques may be used or even techniques that perform direct selective depositions may be used without the need for masking. For example, conformable contact masks may be used during the formation of some layers or during some selective deposition or etching operations while non-conformable contact masks may be used in association with the formation of other layers or during other selective deposition or etching operations. Proximity masks and masking operations (i.e. operations that use masks that at least partially selectively shield a substrate by their proximity to the substrate even if contact is not made) may be used, and adhered masks and masking operations (masks and operations that use masks that are adhered to a substrate onto which selective deposition or etching is to occur as opposed to only being contacted to it) may be used.

In many embodiments, cantilever probes offer good compliance and may be formable from fewer layers than is required for forming vertically extending probes (see for example U.S. patent application Nos. 60/603,030, 10/772,943 and 60/641,341 each of which is incorporated herein by reference) but at the cost of consuming more substrate area. In some situations cantilevered probes may be more preferred than vertically extending probes while in other situations the reverse may be true.

Figure 5A:
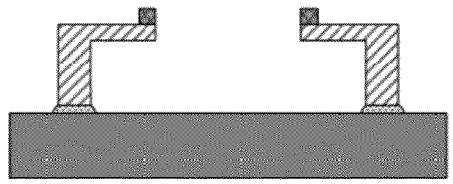
FIGS. 5A-5B depict side views of simplified examples of cantilever probe structures.

A simplified example of two cantilever probe structures are shown in FIG. 5A. As indicated in FIG. 5A, the probe structure includes three main elements, a support column which is bonded to a substrate (e.g. a space transformer), a cantilever arm element that has a proximal end attached to the column and a distal end on which a contact structure or tip exists. As can be seen, the column does not possess any integral base element that extends significantly under the cantilever arm element.

Figure 5B:
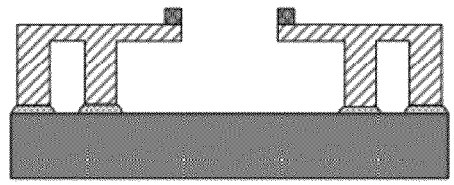

It is possible to make cantilever probe structures having multiple support structures. FIG. 5B shows such a structure having two support columns. The cantilever arm may be considered to have a distal end at which a contact tip is located, a proximal end or central portion at which one of the support columns makes contact and an extension region (i.e. end opposite to the distal end) at which a second column attaches to the arm. In such a multi-support structure, the cantilever portion may be considered that portion which extends from the distal end to the contact point with the closest column.

In the context of the present application, cantilever probe structures are those that have a projected length in the XY plane that is greater than (or even substantially greater than) an overall height of the structure where the height is assumed to extend along a Z-axis which corresponds to the axis along which primary movement of the tip is to occur during contact with a pad or other circuit element. Alternatively, a cantilever structure may be considered that for which the length of a cantilever portion as projected onto an XY plane is substantially greater than the amount of deflection that may be expected of the device along a Z-axis when a tip element is made to contact a pad or other circuit element.

Some embodiments of the invention provide probe structures, or methods of fabricating probes, where the probe structures include a modified base structure that is located adjacent to, or in proximity to, a substrate (e.g. space transformer) and is bonded to it. The modified base structure comprises an elongated structure that has a footprint that (1) underlies at least a portion of a cantilever arm of the probe, or (2) the elongated structure comprises at least two elongated components where a vector sum of a footprint of each of at least two of the elongated components underlies at least a portion of the cantilever arm. Underlying the cantilever arm means that the footprint or vector sum is located between the substrate and the cantilever arm in a plane (or other path) defined by the motion of the cantilever structure during compression.

In some preferred embodiments, the footprint or vector sum underlies the cantilever arm by at least 25% of the cantilever length, more preferably by 50% of its length, even more preferably by 75% of its length, and most preferably by 90 % of its length or more. In some preferred embodiments, the base directly contacts the substrate while in other preferred embodiments only a portion of the base directly contacts the substrate, while in still other preferred embodiments, the base does not directly contact the substrate but is spaced therefrom and adhered thereto by at least one intermediate material (e.g. solder).

Figure 6:
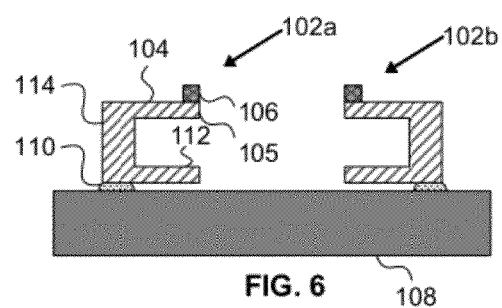
FIGS. 6-17 depict embodiments of cantilever structures having enhanced base structures.

Examples of various enhanced base-structure embodiments of the invention are depicted in FIG. 6 to FIG. 17. FIG. 6 depicts an embodiment of a probe array which comprises two probe structures 102a and 102b each having a cantilever portion or arm 104. At a distal end 105 of the cantilever portion a contact tip 106 is located. The probes are adhered to a substrate 108 by a bonding material 110 which is only located at that portion of the elongated base structure 112 that is directly below riser 114. The distal end and the intermediate portions of the elongated base structure are not bonded to the substrate but are located at or slightly spaced from the substrate. By the extended length of the base structure 112 (which is set to match the length of the cantilever arm) of the elongated base structure, significant plastic, or at least non-elastic, dislocations of the probe tip (that might otherwise result from yield strength loss or yield strength short comings of the bonding material) are minimized or eliminated.

Figure 7:
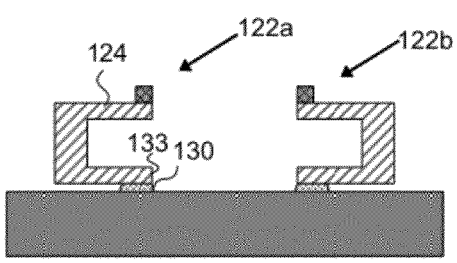

FIG. 7 depicts an embodiment of a probe array which comprises two probe structures 122a and 122b each having a cantilever portion 124 and an elongated base structure or structures whose footprint or vector sum extends the length of the cantilever arm. The probe structure is bonded to the substrate at the distal end of the elongated base structure such that no net shear or tensional force exists on the bonding material 130 as a result of compressional deflection of the probes toward the substrate.

Figure 8:
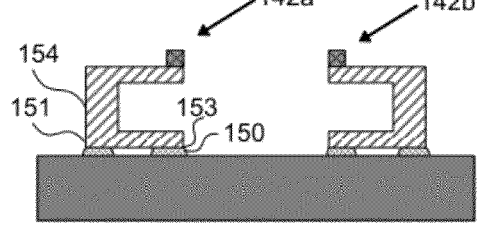

FIG. 8 depicts an embodiment which includes probe structures 142a and 142b which are similar to those shown in FIGS. 6 and 7 with the exception that the probes are bonded to the substrate at both a proximal end 151 (relative to the riser 154) and at a distal end 153 of an elongated base structure via bonding material 150.

Figure 9:
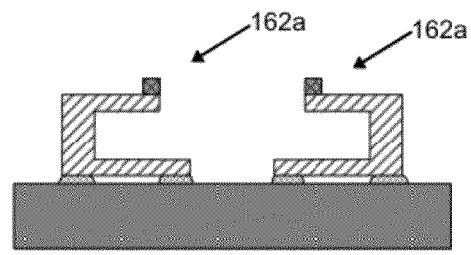

FIG. 9 depicts an embodiment similar to that of FIG. 8 where bonding occurs at both proximal and distal ends of the elongated base structure but where the base structure has a footprint or vector sum (if more than one base structure exists per probe) that extends beyond a projection of the distal end of the cantilever arm onto the substrate.

Figure 10:
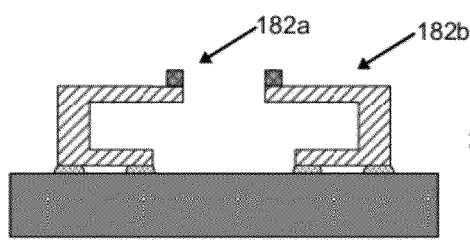

FIG. 10 depicts an embodiment similar to that of FIGS. 8 and 9 where bonding occurs at both proximal and distal ends of the elongated base structure but where the base structure has a footprint or vector sum (if more than one base structure exist per probe) that does not extend as far as a projection of the distal end of the cantilever arm onto the substrate.

Figure 11:
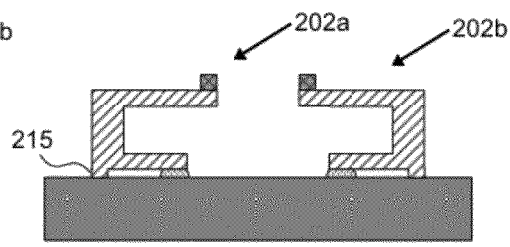

FIG. 11 depicts an embodiment similar to that of FIG. 6 but where bonding occurs only at the distal ends of the elongated base structures but where the proximal end of the base structure is supported by a standoff 215.

Figure 12:
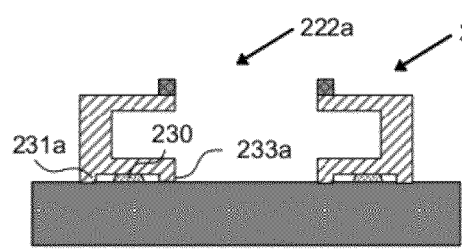

FIG. 12 depicts an embodiment similar to those of FIGS. 6-8 where the length or vector sum of the lengths of the elongated base structure or structures, respectively, match the projection or length of the cantilever arm of the probe. However, in the embodiment of FIG. 12 both the distal end and proximal end of the elongated base structures are supported by standoffs 233a and 231a, respectively, and where bonding between the base structure and substrate occurs in a mid-region of the base structure via bonding material 230.

Figure 13:
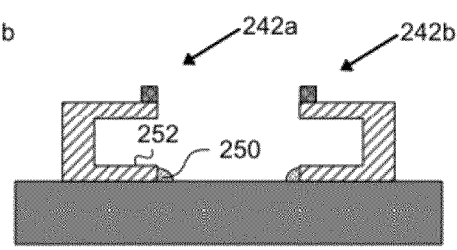

FIG. 13 depicts an embodiment where the elongated base structure 252 is located adjacent to and in direct contact with the substrate 248 and where bonding occurs between the distal end of the elongated base structure and a portion of the substrate adjacent to the distal end via a bonding material 250.

Figure 14:
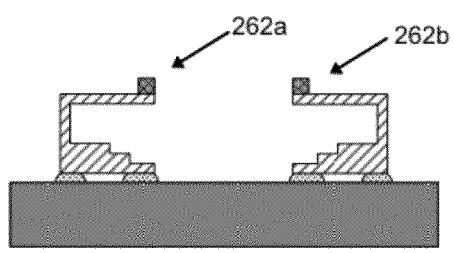

FIG. 14 depicts an embodiment where both distal and proximal ends of an elongated base structure are bonded to the substrate. In this embodiment the base structure is not a relatively thin featureless structure but instead is a structure having variable thickness (e.g. a thickness that decreases near the distal end of the elongated base structure to strengthen the base while not causing interference between the cantilever arm and base structure during deflection of the cantilever). Of course in other embodiments, other configurations are possible.

Figure 15:
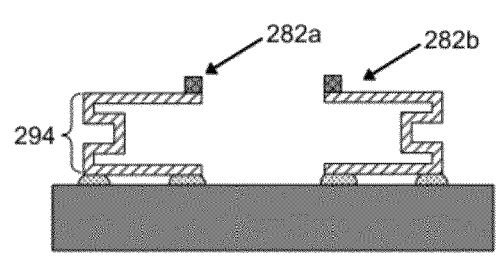

FIG. 15 depicts an embodiment where riser 294 takes on a desired configuration (as opposed to being a beam-like structure that extends perpendicular to a surface of the substrate). The desired configuration may, for example, be a configuration that allows enhanced deflection. Of course, in other embodiments other configurations are possible.

In still other embodiments the cantilever arms may take on various configurations (other than the beam like configurations shown in the above examples).

Figures 16A, 16B, 16C, 16D, 16E, 16F:
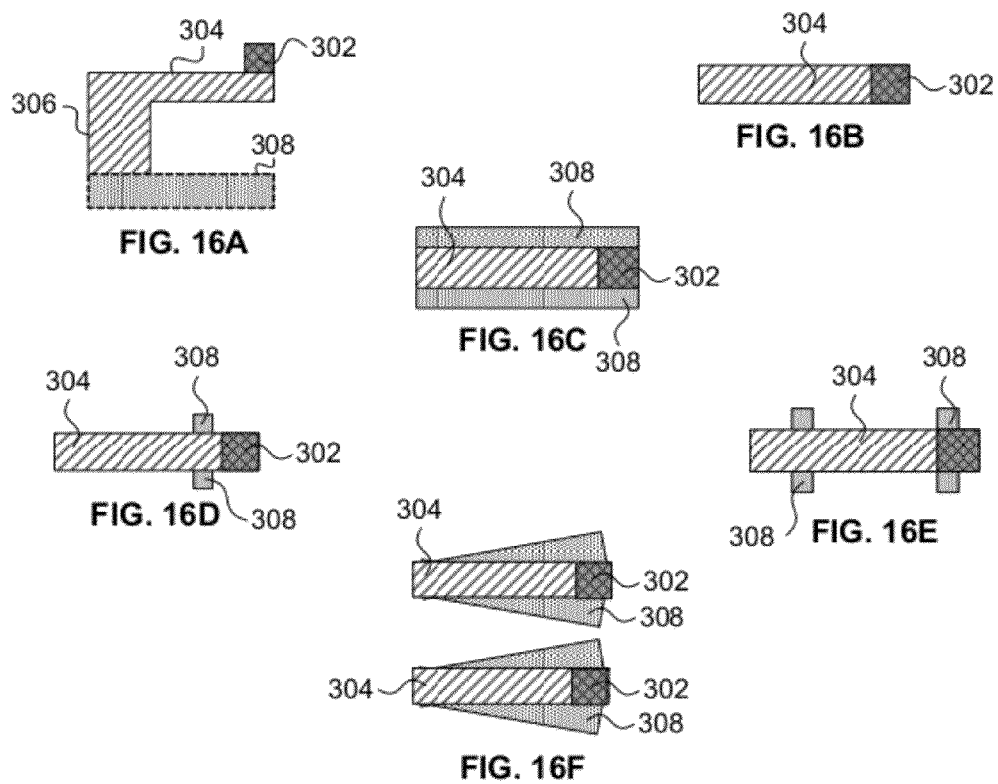

FIG. 16A depicts a side view of a cantilever probe which includes a tip element 302, a cantilever arm element 304, a riser 306, and an elongated base structure 308 while FIGS. 16B-16F depict top views of various example alternative configurations of the probe structure of FIG. 16A. In FIG. 16A, the width (i.e. the dimension extending in and out of the page) of the elongated base structure, or structures, of the probe can not be seen.

FIG. 16B depicts a simple case where the base structure in a top view is completely shadowed by the cantilever 304 and riser portion 302 of the probe.

FIG. 16C depicts a case where the width of the base structure 308 along its entire length is wider than the width of the cantilever structure 304 as evidenced by the fact it can be seen on each side of the cantilever structure. It is believed that such widening may help with stabilization of the probe and more particularly in enhancing its ability to avoid unintended motions outside the plane of the probe (i.e. outside the plane defined by the primary length and height of the probe) particularly in circumstances where the yield strength of the bonding material may begin to fail.

FIG. 16D depicts a case where only a single portion of the elongated base structure 308 near the distal end of the structure has a width that exceeds that of the cantilever portion 304.

FIG. 16E is similar to 16D with the exception that two distinct regions of the base structure 308 extend beyond the width of the cantilever portion 304 of the probe.

FIG. 16F depicts two side-by-side probes where the base structures 308 fan out to become wider at the distal end of the base structure than at the proximal end. In some alternative embodiments, the fanned out elongated base structure may be two elongated structures laid out in a V-shaped configuration (similar to that of FIG. 17 but not as pronounced). In the embodiment of FIG. 16F, it is assumed that the base structures may be formed with their desired configuration while still being spaced far enough apart to allow formation to occur.

Figure 17:
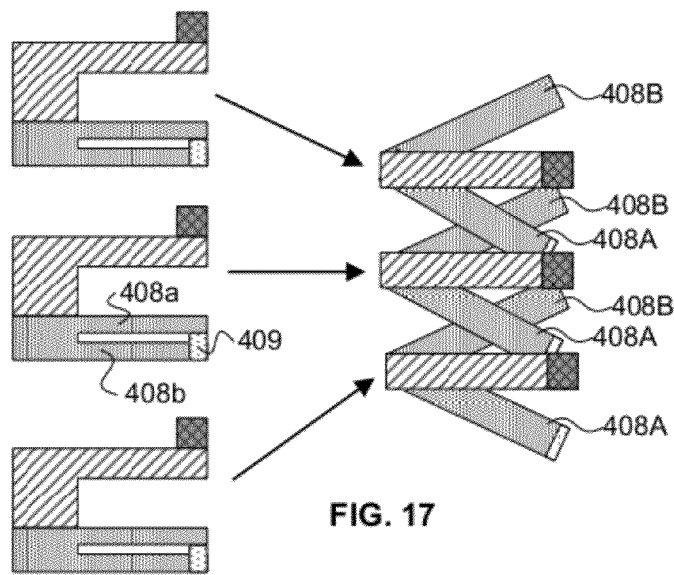

FIG. 17 depicts an array of three probe structures in separated side views (on the left of the figure) and in a top view (to the right of the figure). In the embodiment of FIG. 17 the base structure of each probe comprises two elongated structures 408a and 408b that are configured in a V-shape. Portions of the base structure for each probe overlap base structures from adjacent probes in the plane of the substrate (e.g. in the XY plane) but do not contact the base structures of the neighboring probes due to a designed vertical offset between crossing structures. Elongated base structure 408a is displaced above the substrate by a desired distance and an extension element 409 joints the distal end of structure 408a to the substrate or to a bonding material located between the structure and the substrate. Elongated base structure 408a is formed above an elongated structure 408b of a neighboring probe such that a desired gap exists between them. It is believed that probe arrays such as those shown in FIG. 17 may offer more stability in situations where the probes will be subject to forces or displacements perpendicular to the plane defined by the cantilever arm and space it sweeps out during compressional motion toward the substrate.

Figure 18A:
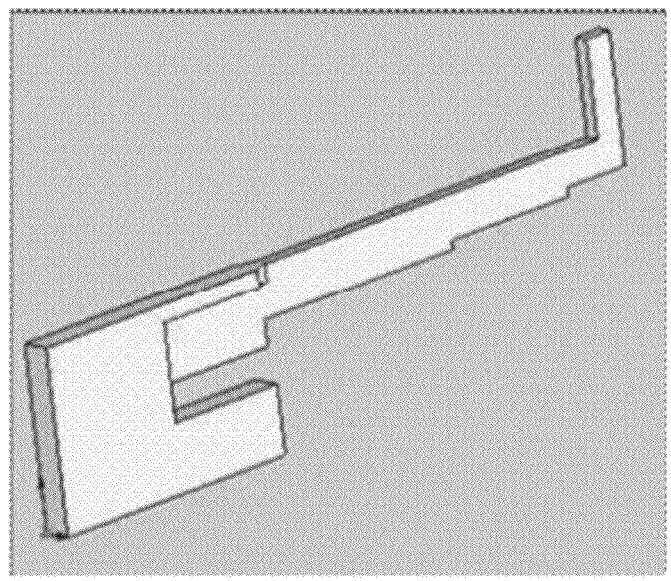
FIGS. 18A-18B depict a perspective view of an example cantilever probe structure having an improved base structure.
Figure 18B:
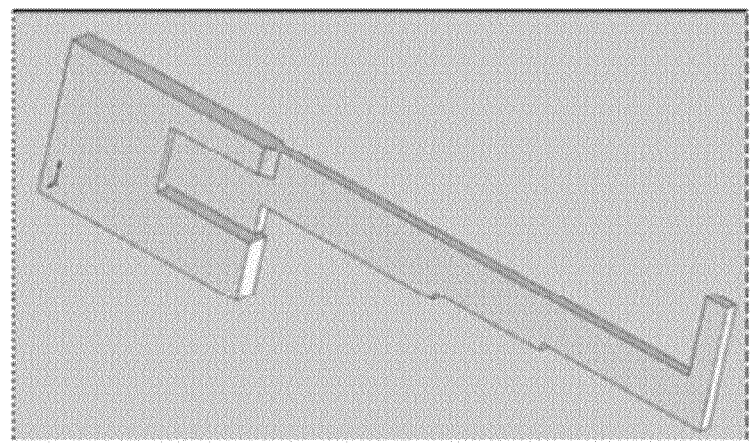

FIG. 18A and 18B provide two perspective views of an example cantilever probe which includes a base element with a footprint that partially underlies the cantilever portion of the probe. The cantilever portion of the probe is depicted as comprising a relative complex configuration that starts off relative wide and deep at the proximal end that then becomes thinner and shallower near the distal end (i.e. the tip end).

FIG. 19 depicts a top view of an array 302 of seven cantilever probes elements 304A-304G which form a linear contact pattern along line 306. In the figure, cantilever portions are shown with dashed lines and are shown as narrower in width than the riser portion (e.g. support or column portion) and base portion. In the figure, bonding regions 312A-312D are shown as being still wider. The desired spacing between the adjacent probing locations is obtained via left-right interlacing of the adjacent probing locations (i.e. one location is probed from the right while the adjacent probing locations are probed from the left, etc.). The left-right interlacing alone does not allow small enough pitch by itself and the remaining pitch reduction is obtained by locating bonding pad locations at different positions on adjacent probes. Positions of bonding pads have interlaced positions along the x-axis so that they do not contact and overlap along the y-axis.

FIGS. 20A and 20B show perspective views from the top and bottom, respectively, of a six probe array where all probes 324A-324F extend from the same side of a contact line and where bonding region interlacing is used to allow the probes to be located closer together than would be allowed without the interlacing. Furthermore, the array shows that probe elements are provided with openings 326A-326F along the base which allow bonding elements (e.g. bumps or pads) 322A-322F to overlap the footprint of adjacent probes without causing electrical shorting between the probes. In other embodiments, two step shifting, for example, may be used instead of the three-step shifting as illustrated in the example of FIGS. 20A and 20B.

FIG. 21 shows a perspective view of two sets of six element probe arrays that form two contact lines and which have the same interlacing and bonding location compensation openings as noted with regard to FIGS. 20A and 20B.

FIG. 22A depicts perspective views of two probe elements 352 and 354, having an alternative pattern of widened bonding regions and their use in forming an example four probe array 356. FIG. 22B depicts a top view of an extended array of the probes 352 and 354 where the spacing between adjacent probes and the overlapping XY regions containing adjacent probes may be better seen. FIG. 22B is analogous in its depictions to those shown in FIG. 19. It is noted that only half the probes in this array use the base structure that have footprints that underlie their cantilever portions. In alternative embodiments, it may be possible to form probes 354 with enhanced base structures (i.e. base structure that offer footprints that underlie their cantilever portions) by using the opening technique of FIGS. 20A, 20B, and 21.

Various alternatives to the embodiments set forth above exist and will be apparent to those of skill in the art in view of the teachings set forth herein. For example, EFAB™ fabrication techniques may be used to form all or a portion of the probe structures. For example, arrays may be formed using more than the two or three probes illustrated in FIGS. 6-17. In some embodiments, probe tips may be formed separately from the main body of the probe array and then transferred to the main body of the probes. In some embodiments, adhesion between probes and substrates may be formed by solder bonding, brazing, diffusion bonding, via other bonding techniques, and/or via a combination of approaches. In some embodiments each probe may have multiple contact tips, each probe may have multiple cantilever arms, and/or each probe may have one or more risers. In some embodiments different probes of an array may take on different configurations. In some embodiments, the probe structures with enhanced base configurations may be used even when the probes are formed directly on the substrate while in other embodiments their use may be limited to embodiments where probes are formed on temporary substrates and then transferred to permanent substrates. In some embodiments, transfer bonding may occur one probe element at a time or in arrays that contain multiple pre-aligned probes.

In some embodiments, probe elements may be formed in an up-right configuration (i.e. building axis is parallel or anti-parallel to that of the primary motion when the probe tip or array of probe tips are deflected) or in a side-ways or rotated configuration. In the up-right configuration more probes may be formed simultaneously on a given substrate area while in the side-ways configurations fewer layers are needed to form any given probe.

In some embodiments cantilever probes may have one or more support elements (e.g. columns or risers) that extend from a base element to the cantilever portion of the probe along a vertical path, a path containing a vertical component, or even along a convoluted path. In embodiments, where multiple support elements are provided, not all support elements need to be bonded or attached to the cantilever structure but instead they may merely contact the cantilever structure either all of the time or only during particular amounts of deflection of the structure.

In some embodiments, the simple cantilever structures depicted may be replaced by more complex or sophisticated structures. Cantilever elements may have more complex configurations.

Some embodiments of the present invention provide cantilever structures that have base elements which can be made to interlock with structures on a substrate so as to limit or restrain movement between the base and the substrate in a Z direction and to limit or restrain movement of the base relative to the substrate along a dimension which is perpendicular to the Z direction. These interlocking base structures may or may not have portions which extend beyond the riser portion of the cantilever probe.

FIGS. 23A-23C depict examples of cantilever structures 502A-502C which have base elements 504A-504C which have "L" shapes and which may be made to slide into a slotted structure on a substrate and particularly a slotted structure that has an undercut into which the base of the "L" may slide. Such a base structure is depicted in FIG. 24A while FIG. 24B depicts probe structure 502A which has been slid into slotted structure 512 of FIG. 24A.

Slotted structure 512 of FIG. 24A includes a cantilever element 514 which offers some compliance and a snug fit as a probe element is slid into place. In some embodiments, the base structure of a probe element may take on an "L" shape configuration while in other embodiments the base structure may have an upside down "T" configuration such that when slid into a base element the structure is locked into place on each side of the cantilever element. A "T" shaped configuration is more clearly seen on the base elements of probe elements 602A, 602B and 602C of FIG. 26.

Once slid into place the probe elements may be held in position and in electrical contact with the substrate by frictional forces or alternatively they may be locked into place by an appropriate mechanical mechanism. In still other embodiments the probe elements may be bonded to the base structures by solder or conductive epoxy or the like. In some embodiments the probe elements may be removable (if damaged) so that a replacement element may be inserted. Such replacement may occur by simply reversing the motion that led to mating in the first place, or by releasing locking elements or by heating to melt a bonding material or controlled etching to remove a bonding material or the like.

Figure 25A:
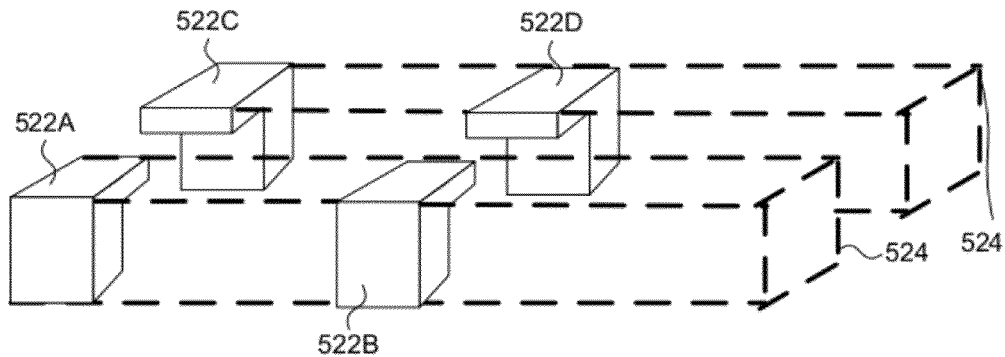

FIGS. 25A depicts a perspective view of a mounting structure that includes four clips 522A-522D as opposed to the two slots of FIG. 24A. FIG. 25A shows where a slotted base structure like 512 of FIG. 24A would be located using dashed outlines 524. In the embodiment of FIG. 25A, two clips hold down each side of a "T" shaped base structure. In some alternative embodiments, it may be sufficient to have a single pair of clips hold a probe having an "L" or "T" shaped base structure or having a base structure having tabs that extend from an elongated base in those locations where clips are to be located.

Figure 25B:
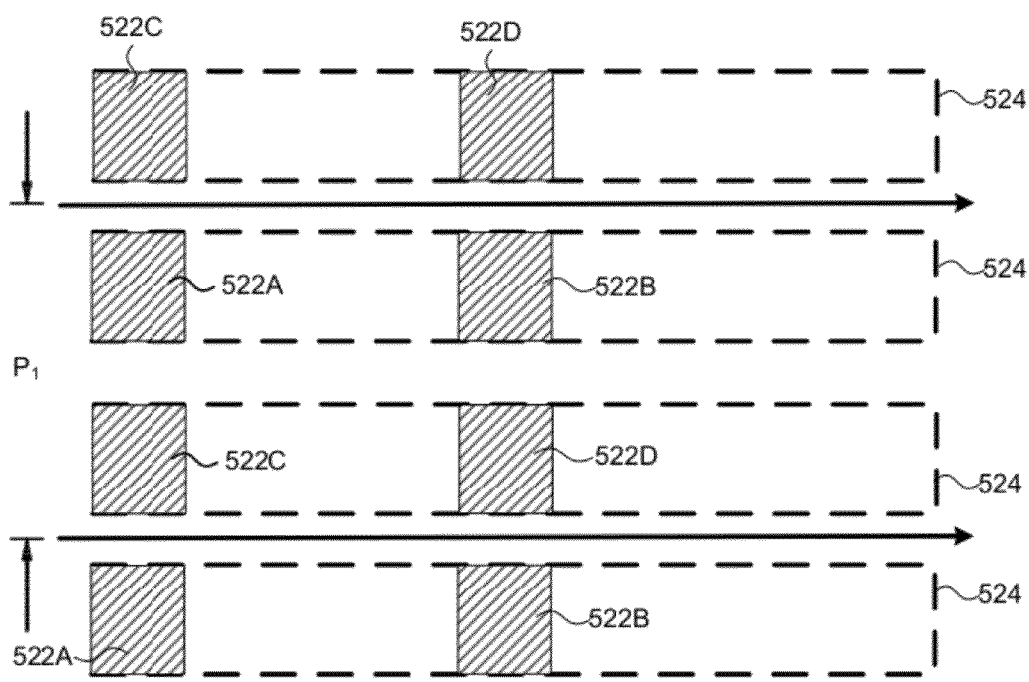

FIGS. 25B depicts a top view of two sets of clip elements 522A-522D for two adjacent cantilever probes that are to be located with a pitch corresponding to distance $P_1$. With the clips aligned with one another for holding adjacent probes, the probes can not be formed any closer together because of a minimum feature size limitation. FIG. 25C depicts a top view of two sets of clip elements 522A-522D for two adjacent cantilever probes where the locations of the clips have been shifted so that they may be located closer together thereby allowing probes held by the sets of clips to be located at a distance $P_2$ from one another which is smaller than distance $P_1$.

The probe elements of FIGS. 23A-23C or other probe elements of some embodiments of the present invention may be formed in an upright position (i.e. with the height extending in the vertical or Z direction and with layers being formed parallel to the XY plane. In other embodiments the structures may be formed lying sideways such that fewer layers are necessary to form the structures. If formed on their sides multiple probes may be formed above one another and interlacing of probe elements may occur to greatly improve fabrication efficiency and yield.

Clip or retention elements into which probe elements will have their bases inserted may be formed directly on space transformers or other desired substrates or may alternatively be transferred to space transformers or other desired substrates using transfer techniques disclosed in a number of the applications set forth below.

Figure 26:
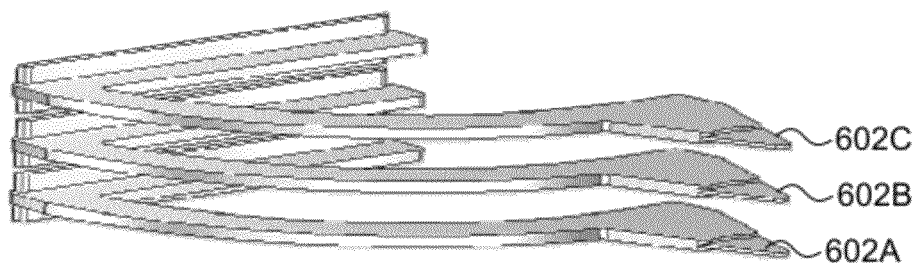
FIG. 26 depicts a perspective view of a plurality of probe elements lying in a sideways orientation and stacked one above the other as they may be formed according to some embodiments of the invention.

FIG. 26 depicts probe elements 602A-602C lying in a sideways orientation and stacked one above the other as they may be formed according to some embodiments of the invention.

In some embodiments, it may be possible to form and transfer probe elements in groups while in other embodiments, transfer of probe structures to space transformers or other desired substrates may occur manually or by pick-and-place machines.

Figure 27:
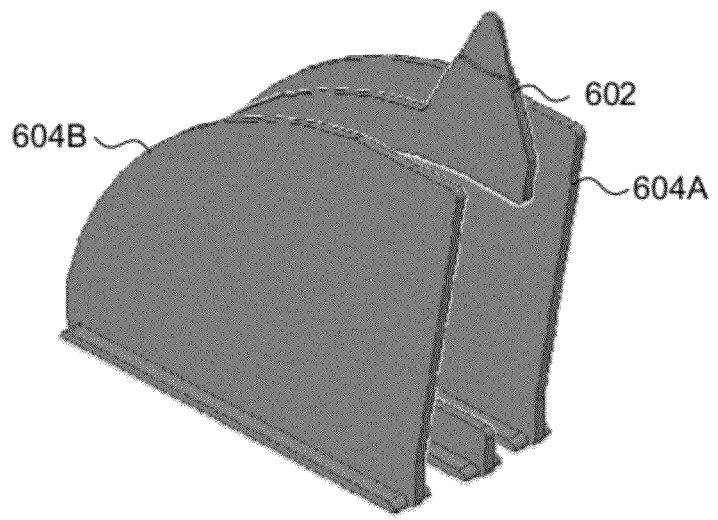
FIG. 27 depicts a perspective view of an example of an alternative embodiment where probe elements are separated from other probe elements by shields.

FIG. 27 depicts an alternative embodiment of the invention where each probe element 602 or selected probe elements 602 are separated from other probe elements by shields 604A and 604B. These shield elements may provide improved impedance characteristics for the signals that will be carried by probes 602. Shield elements 604A and 604B may be formed by techniques similar to those used in forming probe elements 602. In some embodiments as previously noted, probe elements may be made to mechanically lock into position on base structures.

Figure 28A:
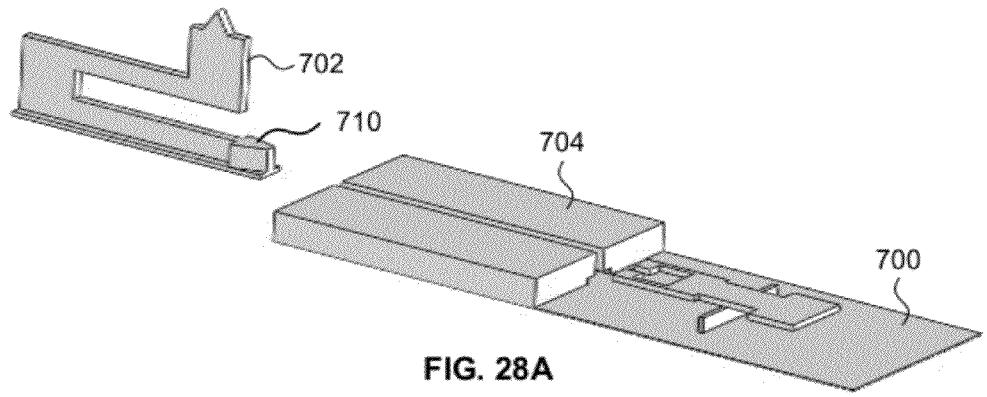
FIGS. 28A-28C provide perspective views of an example of a probe element having a protrusion on its base which may be slid into a retention structure on a substrate and locked in place by a locking element.
Figure 28B:
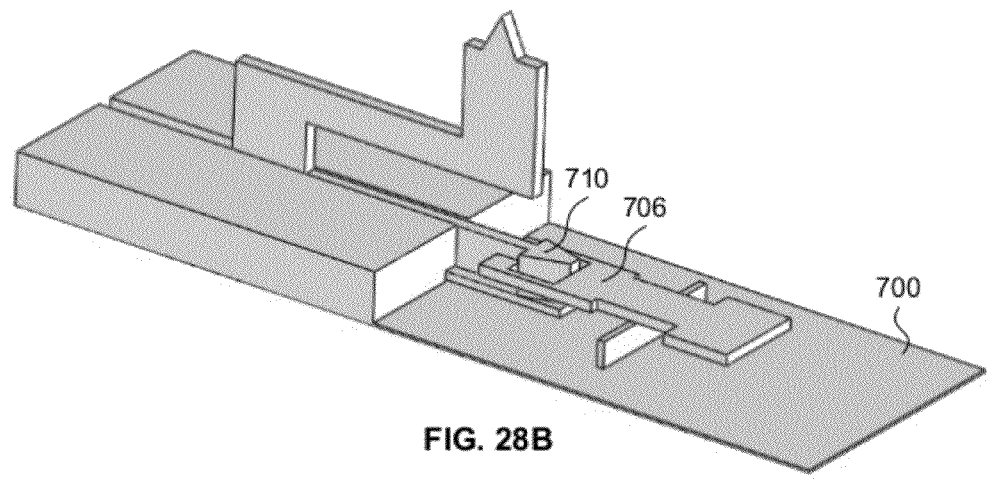
Figure 28C:
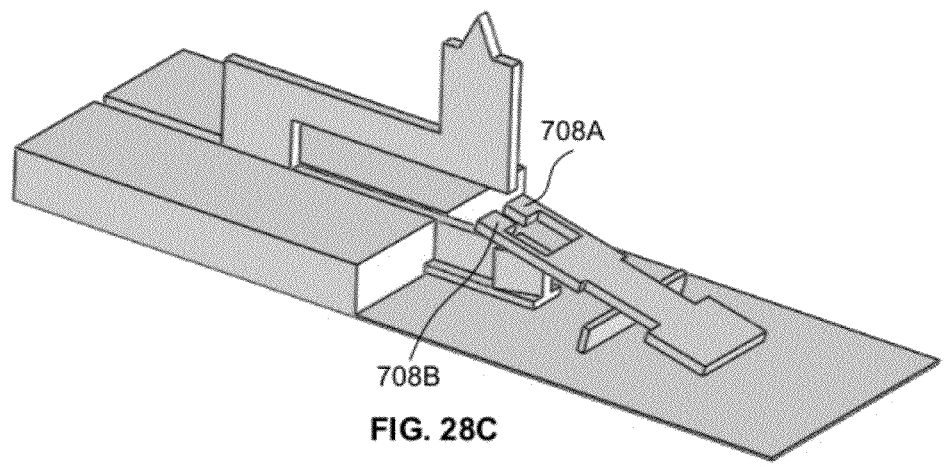

FIGS. 28A-28C show an example of a probe element 702, having a protrusion 710 on its base, which may be slid into retention structure 704 on a substrate 700 and locked in place by locking element 706 which may be rotated up and down. When locking element 706 is in the down position probe element 402 may be slid into position causing arms 708A and 708B to split apart and then reseat around protrusion 710. If the probe element 702 needs to be replaced, locking mechanism 708 may be rotated to an upper position which releases element 710 and allows probe 702 to be removed from base 704. In another alternative embodiment the cantilever element 514 of base 512 of FIG. 24A may have a locking element located at its distal end which may be used to engage a hole or notch in a base element, thus locking the probe and base together once the desired mating position is reached.

Release of the probe element may occur by a tab or other mechanism which would allow cantilever portion 514 to rotate upward (not shown). It should be understood that other locking elements may be used in fixing probe elements in desired positions relative to otherwise unrestrained directions of motion. Such elements may exist on the base structure itself as discussed with regard to FIG. 24A may exist on the backside of base structure as discussed in association with FIGS. 28A-28C, or alternatively, they may be located on the entry side of the base structure. Such locking elements on the entry side might be spring-loaded elements that may be momentarily pushed aside to allow the probe element to be mated with the base and thereafter may be allowed to move back into a locking position.

In still other embodiments, contact between the base structure and the probe element may occur by spring-like elements that may be forced into compression or tension during the loading of the probe element and which force may be used to constrain the probe element from further motion once located in its desired position.

In still other embodiments no locking elements may be necessary but it may be desirable to include fixed stop elements located on the probe and/or the base element that can interact with the other components and which may be used to fix and/or detect proper seating position once the probe is loaded into the base. In the various embodiments of the invention discussed above, loading of probe elements into base structures occurs by linear motion by the mating of a slot or clips and a rail-like element.

In other embodiments, however, probe structures and base structures may be designed to allow insertion and retention by rotational motion with or without linear motion. Such rotational motion may occur along an axis parallel to the Z direction or alternatively it may occur along an axis of rotation perpendicular to the Z direction (e.g. a 30°-90° rotation along the X- or Y-axis).

In still other embodiments, the rail-like structure forming the base, or on the base, of the probe may be replaced by tabs. In still other embodiments, the rail-like structure on the base, or forming the base, of the probe may be moved to the substrate while clips or retention structures may be moved to the base of the probe.

As with other embodiments of cantilever probe structures, the contact portion of the probe structure may be formed from a different material than the rest of the structure or it may alternatively be formed from the same material. The configuration of the tip may occur via the same process that is used to form the rest of the probe structure or alternatively may involve the use of a different process which may occur before, after, or in parallel to the formation of the rest of the structure.

The tip may be bonded to the rest of the structure during formation or may be transferred after formation of both the tip element and the rest of the probe structure. During use of the probe elements of some embodiments, it will typically be desired to have arrays of probe elements which may be located in close proximity to one another and for which different properties may be desired. As such, it may be preferential in some embodiments to mix and match probe designs with one another to achieve various results such as desired spacing between elements or desired probe tip location in a given plane or desired probe tip locations in multiple planes.

In another group of embodiments of the present invention, a single large or thick cantilever beam may be replaced by an array of smaller beams (i.e. 2 or more beams). Such multi-beam structures can achieve both a relatively large displacement and a large force. For example, using such structures it may be possible to achieve a 100 µm displacement at 6 grams of force at the probe tip with no plastic deformation of the cantilever probe. To achieve this with a single beam, the beam needs to be long enough to provide sufficient displacement at a reasonable stress, and thick enough to achieve a reasonably high force. As a result, typically the single cantilever beam must be larger for a given application.

Figure 29A:
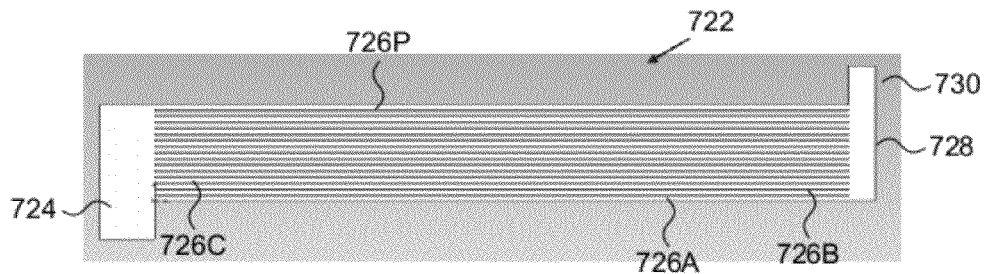
FIGS. 29A-29B respectively provide a side view and a perspective view of an example multi-beam cantilever probe according to some embodiments of the invention.
Figure 29B:
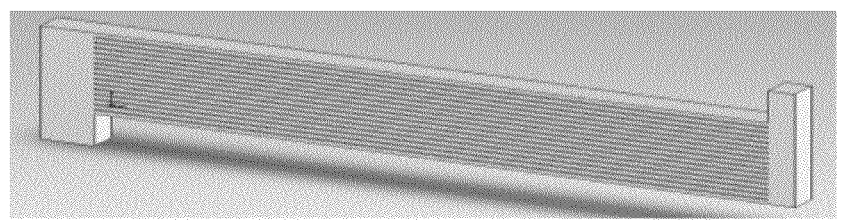

In the present group of embodiments, a composite beam is formed from many thinner beams. A very thin beam, even if it is only about 1 mm in length can deform in excess of 100 µm without plastic deformation. But a thin beam does not produce a large force. By stacking multiple thin beams and supporting them such that they all displace together, their force contributions add individually, while each is able to reach the desired deflection without plastic deformation. An example of a cantilever probe formed from such a stacked set of beams is depicted in the side view of FIG. 29A and the perspective view of FIG. 29B. The cantilever 722 of FIGS. 29A and 29B includes a column or riser 724, a plurality of beams 726A-726P each connected on a proximal end to the column 724 and on the distal end to a joining structure 728 that includes a tip 730 as shown in FIG. 29A and 29B.

By varying the length, width, thickness, and number of beams, virtually any desired load-deflection characteristic may be achieved.

Figure 30A:
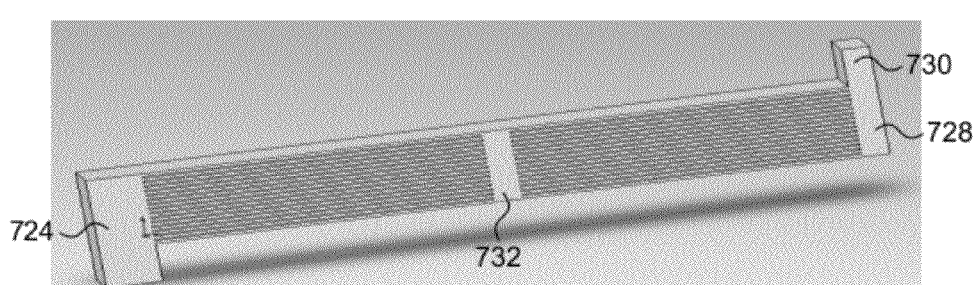
FIGS. 30A-30B provide perspective views of example multi-beam cantilever probes having one bridging element (FIG. 30A) or multiple bridging elements (FIG. 30B) that connect the otherwise independent beams together according to some embodiments of the invention.
Figure 30B:
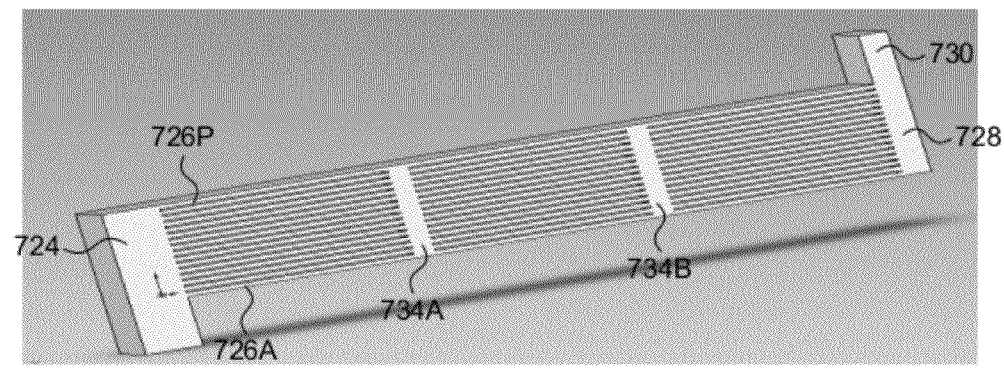

Often, it is desirable to keep the length and width at or below some required specification limit, such as for example a 1 mm beam length and 40 or 50 µm width, so that the probes and arrays of probes can accommodate the most demanding fine-pitch IC layouts. By fixing the length and width, having only thickness and number of beams to adjust may not provide sufficient design flexibility to meet all desired specifications. Another useful design feature is to effectively shorten the beam length by adding additional supports along the beam length. An example of such shortening via bridging elements is depicted in the perspective views of FIGS. 30A and 30B where like elements to those found in FIGS. 29A and 29B are labeled with like reference numbers and where the single bridging element of FIG. 30A is labeled with reference number 732 and the dual bridging elements of FIG. 30B are labeled with reference numbers 734A and 734B. These bridging elements may be considered a way to array multiple composite beams horizontally rather than vertically. Since beam stiffness has a length cubed relationship, shortening the beams in this manner can provide substantially higher stiffness (and therefore force) even with very thin beams.

Figure 31:
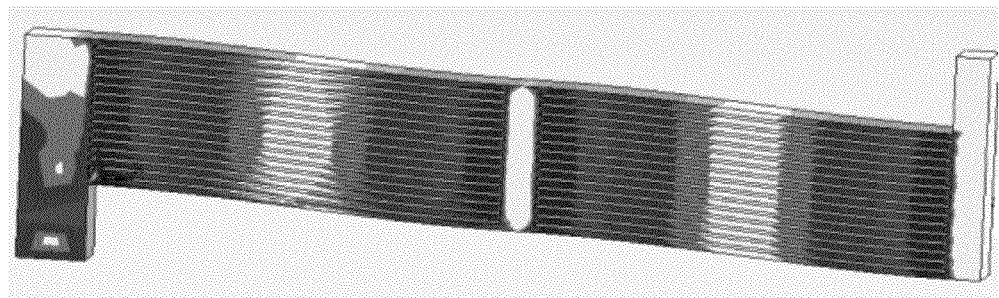
FIGS. 31 and 32 provide stress distribution plots for the probes of FIGS. 30A and 30B respectively.
Figure 32:
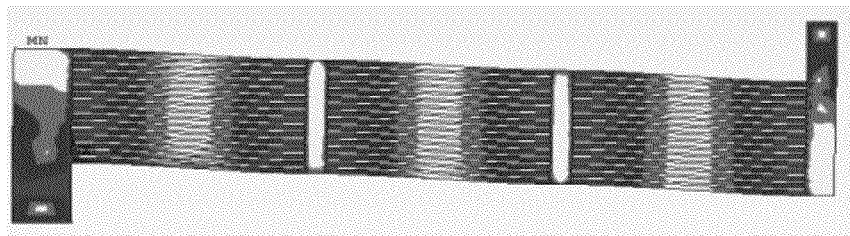

A common design objective in microprobes is to achieve as large a load and deflection as possible in as small a volume as possible. This means that the spring probe must absorb as much elastic deformation energy as possible. To achieve this and avoid plastic deformation, it is desired to distribute stress throughout the structure as evenly and efficiently as possible. The composite beam designs may incorporate several features which help to distribute stress. In a cantilever supported at one end, most of the stress occurs at the fixed end. But the way the composite beams are rigidly supported at both ends prevents rotation at the beam ends. This creates stress at both beam ends, which may distribute stress more efficiently (i.e. uniformly) than that resulting from a single beam. Furthermore, compared with a single beam, where most of the stress may be located primarily on the top and bottom of the beam and where the middle of the beam bears little load, an array of thinner beams more efficiently distributes stress throughout its volume. Finally, adding the additional bridging elements, as exemplified in the embodiment of FIGS. 30A and 30B, stress may be spread more uniformly throughout the structure. FIG. 31 and FIG. 32 provide stress distribution plots for given amounts of tip deflection for the probe designs of FIGS. 30A and 30B.

Stress is distributed more efficiently in the embodiment of FIG. 30B than in FIG. 30A as can be seen form the plots of FIGS. 32 and 31 due to the presence of the extra post.

Figure 33A:
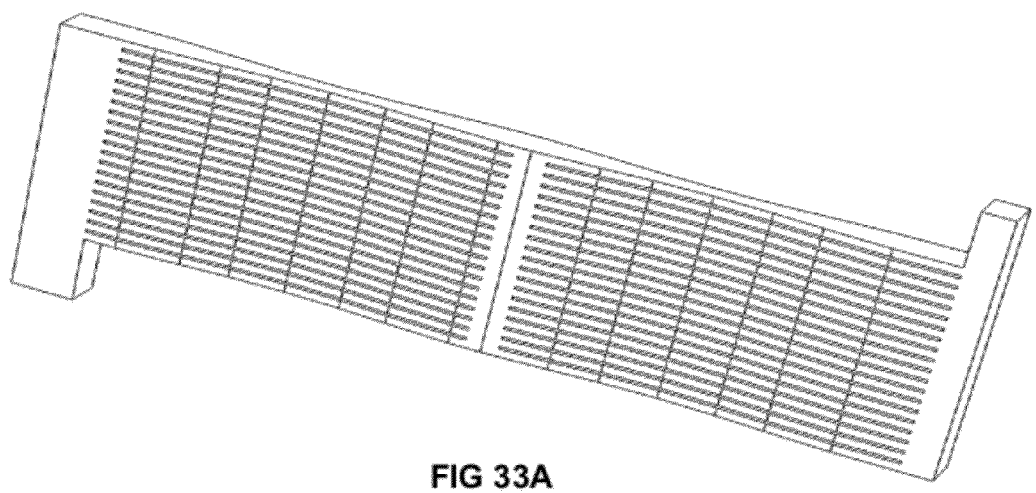
FIG. 33A provides an example of an alternative probe configuration according to some embodiments of the invention where the width of the beams are narrowed in the lower stress regions and widened in the higher stress regions.
Figure 33B:
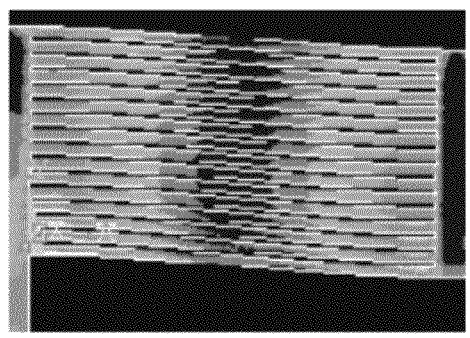
FIGS. 33B-33C depict stress distributions comparing a fixed beam width design (FIG. 33B) with a varying beam width design (FIG. 33C).
Figure 33C:
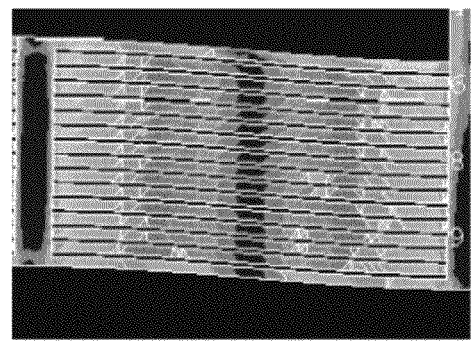

Another possible way to improve stress distribution is to create a varying beam width along the length of the cantilever, for example making the beam narrower in lower stress regions and wider in higher stress regions. An example of such an alternative design configuration is shown in FIG. 33A. FIGS. 33B-33C depict stress distributions comparing a no taper or varying beam width design (FIG. 33B) with a taper or varying beam width design (FIG. 33C) where it can be seen that the variable beam width design shows a more uniform stress distribution.

One added benefit of constraining the beam rotation at both ends is that it may reduce the scrub length compared with a single beam cantilever.

Figure 34A:
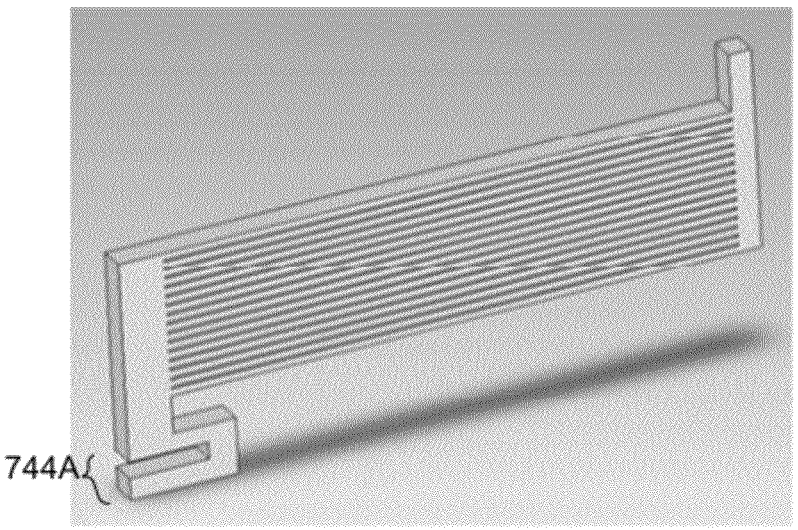
FIGS. 34A and 34B depict perspective views of multi-beam cantilever embodiments providing additional compliant structures.
Figure 34B:
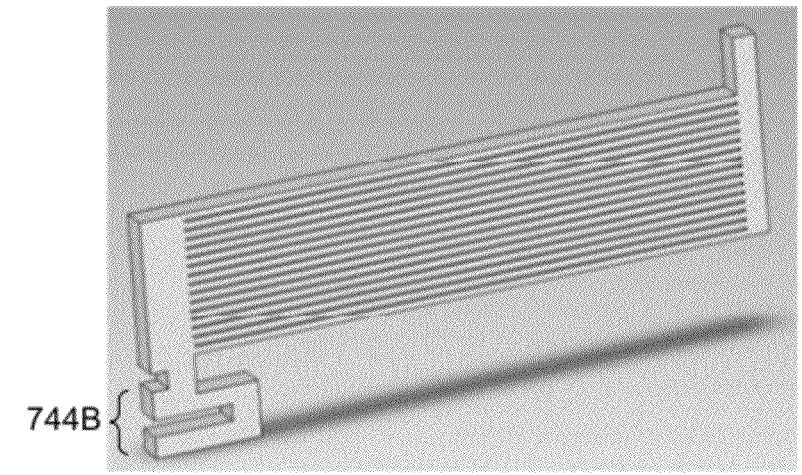

In other embodiments, additional spring elements (i.e. compliant elements) may be added. As shown in the perspective views of FIGS. 34A and 34B a large spring 744A or 744B, respectively, may be added on the common support post (e.g. riser or column) near the base of the structure. Some additional rotation capability may be introduced which reduces the amount of pure bending that the beams must undergo.

Figure 35A:
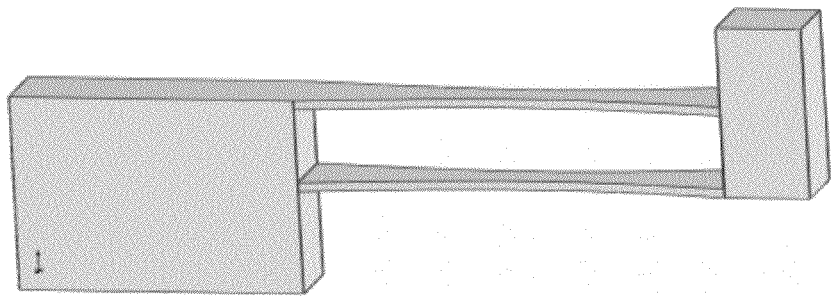
FIGS. 35A and 35B provide perspective views of an example undeflected and deflected two-beam cantilever structure.
Figure 35B:
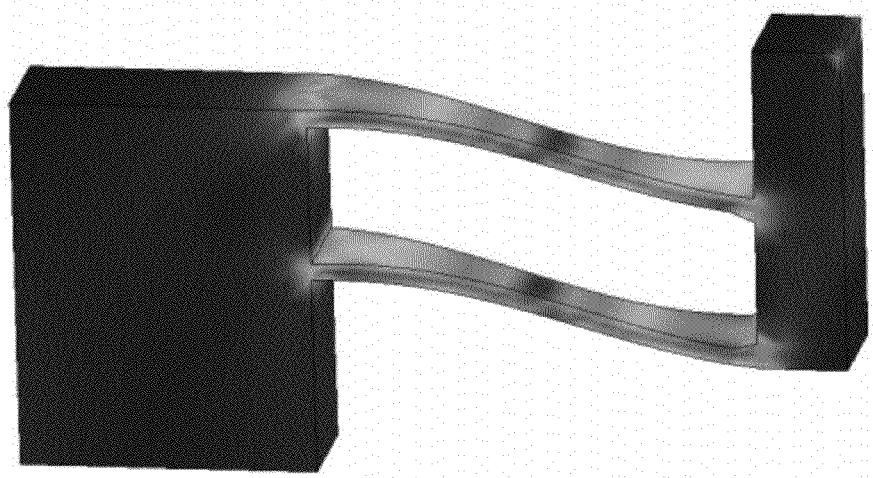
Figure 36A:
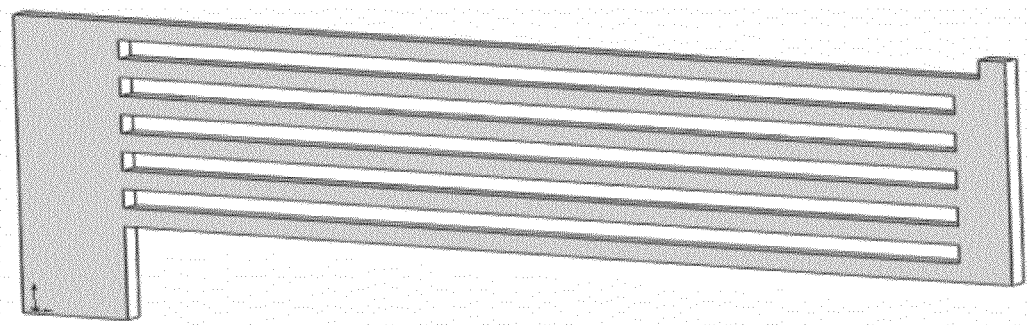
FIGS. 36A and 36B provide perspective views of an example undeflected and deflected six-beam cantilever structure.
Figure 36B:
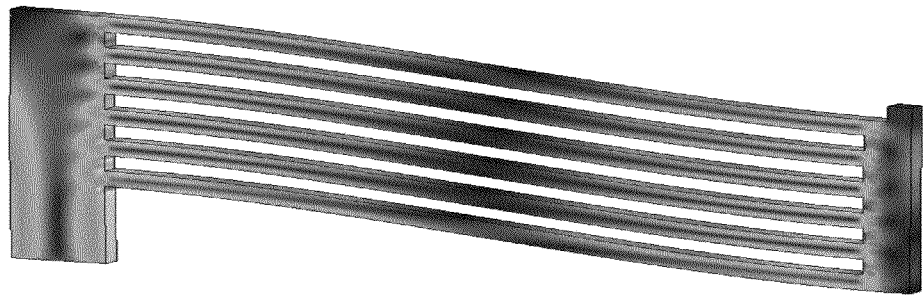

In other embodiments, different numbers of beam elements may be used to form the composite beam. In some embodiments, the composite beam may include only two elements. An example of a two beam probe is depicted in an un-deflected perspective view of FIG. 35A and a deflected perspective view of FIG. 35B. In other embodiments 3, 4, 5, 6 or more beams may be present. An example of a six beam probe is depicted in an un-deflected perspective view of FIG. 36A and a deflected perspective view of FIG. 36B.

Figure 36C:
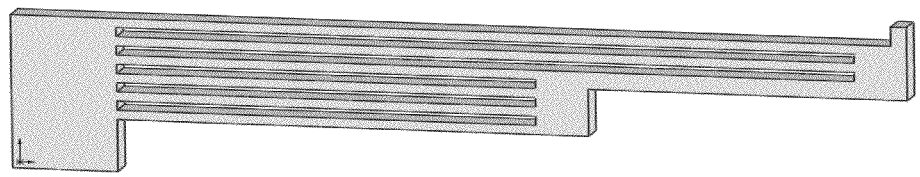
FIGS. 36C-36E provide perspective views of multi-beam cantilever structures having shortened beam lengths or beams of different thicknesses.
Figure 36D:
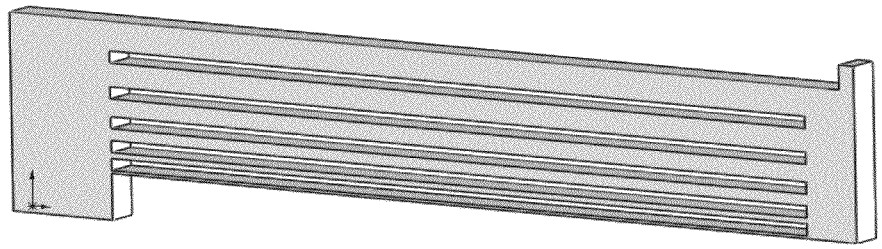
Figure 36E:
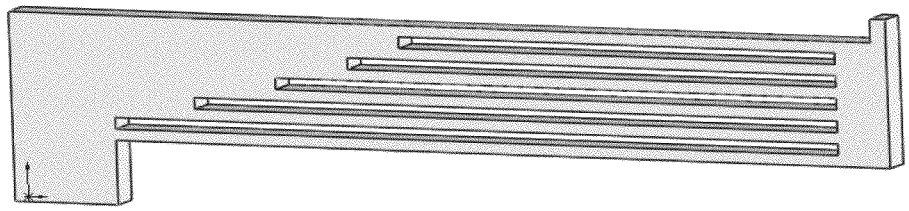

In some embodiments each beam element of the composite beam need not be of the same length and in fact some beam elements may end short of a contact end of the composite beam as exemplified in the embodiment of FIG. 36C. In other embodiments, each beam element of the composite beam may not have a common thickness with all other beam elements as exemplified in the probe design of FIG. 36D. In still other embodiments, beam element thicknesses may be common for some or all of the beam elements. In some embodiments each beam element of the composite beam may extend to the contact end of the beam but each beam element, or some beam elements, may have different lengths with shorter beam elements merging into a larger beam structure at one or both ends of the cantilever as exemplified in the probe design of FIG. 36E.

Figure 36F:
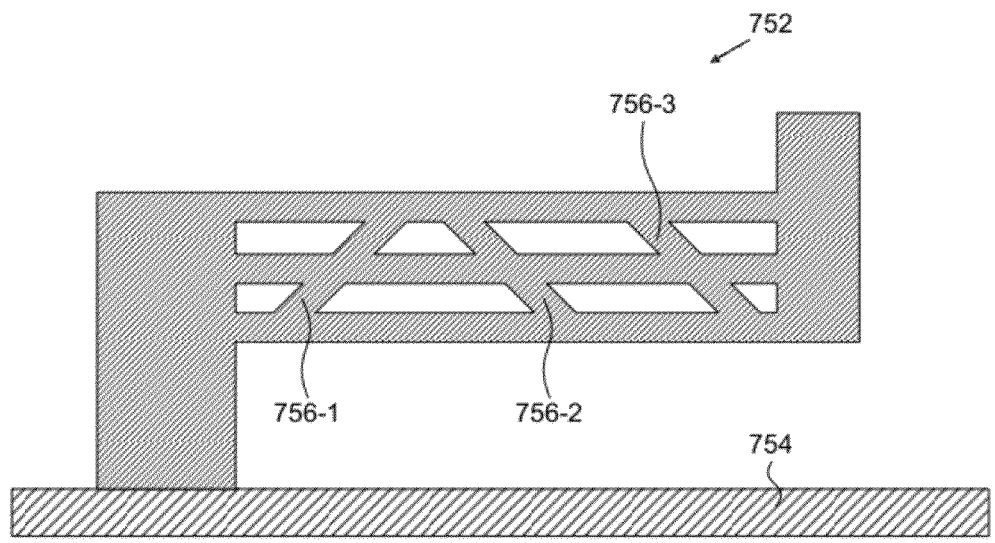
FIGS. 36F-36K provide various side views of multi-beam cantilever structures having non perpendicular bridging elements.
Figure 36G:
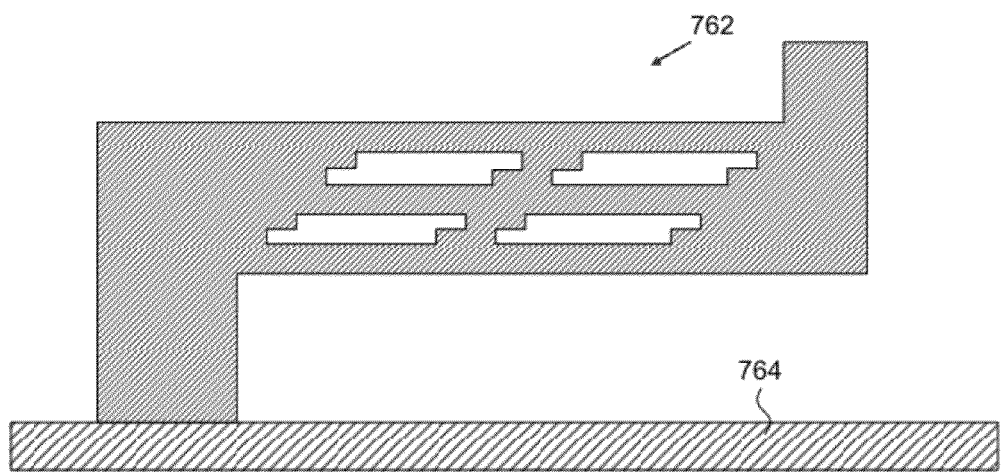
Figure 36H:
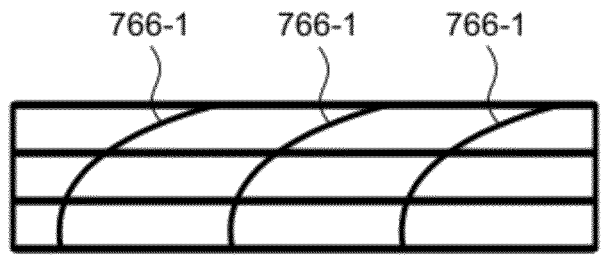
Figure 36I:
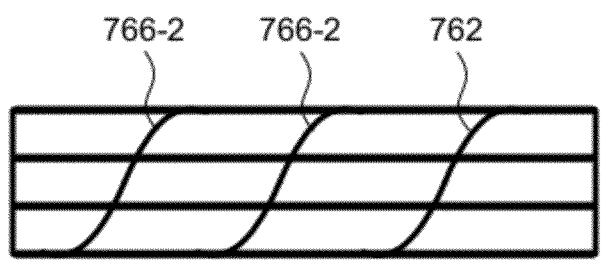
Figure 36J:
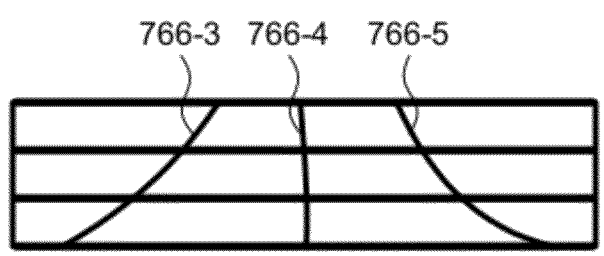
Figure 36K:
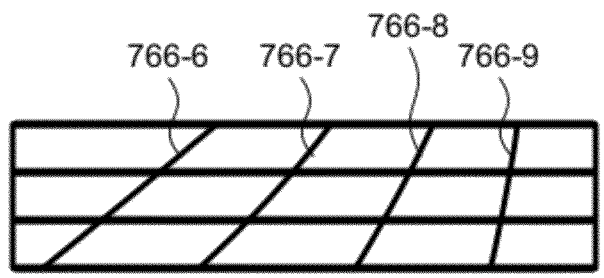

In still other embodiments, it is possible to aid in spreading stress more uniformly using other structural designs. For example bridging elements may be made to connect beams in an oblique manner instead of a vertical manner. Examples of such oblique designs are illustrated in FIGS. 36F-36K. FIGS. 36F and 36G depict entire cantilever probe structures 752 and 762 sitting on substrates 754 and 764 respectively while FIGS. 36H-36I schematically depict side views of only the cantilever portions of alternative probe configurations. As shown in FIG. 36F, bridging elements 756-1, 756-2, to 756-3 may run in a common non-vertical direction (e.g. as indicated by elements 756-2, to 756-3) or in opposing directions (e.g. as indicated by elements 756-1 and 756-2 or elements 756-1 and 756-3). As shown in FIG. 36G, bridging elements may run in a non-vertical direction that matches a bridging pattern existing at either one or both of the column end or tip end of multibeam structure. FIG. 36H indicates that bridging elements 766-1 may all run in the same direction and further that they need not have a linear aspect to them but instead may be curved. FIG. 36I indicates that the bridging elements 766-2 may have more complex or compound curved shapes (e.g. S-shapes). FIG. 36J indicates that the bridging elements 766-3, 766-4, and 766-5 may each have different and even opposing configurations. FIG. 36K indicates that the bridging elements 766-6 to 766-9 may take on progressively varying slopes or configurations as the beam elements are traversed from support column to a final bridging element at the tip.

In some embodiments, it may be possible to determine optimal bridging element location or locations and configuration or configurations by performing a design simulation (e.g. initially without bridging elements) and locating regions of minimum stress and maximum stress and then designing and locating the bridging elements according to the determined stress patterns and repeating the simulation and design process one or more times as necessary. For example, it may be desirable to locate bridging elements in the regions of minimum stress and to cause them to take on configurations that match or at least partially match the minimum stress configurations. It is generally desirable to minimize discontinuities and as such, it is preferred that layer thicknesses as small as possible be used (to achieve minimum discontinuities based on layer pixilation) when the probes are formed in an upright position (i.e. the axis of deflection of the probe matches the axis of stacking layers). When building probes lying on their sides it is preferred to minimize discontinuities by making smooth transitions from cantilever beams to bridging elements within individual layers.

In some embodiments, multi-beam cantilever need not end at a common riser or support column but they may instead extend directly to the substrate or even follow a more circuitous route such as the "C" shapes of FIGS. 37A-37F.

Figure 37A:
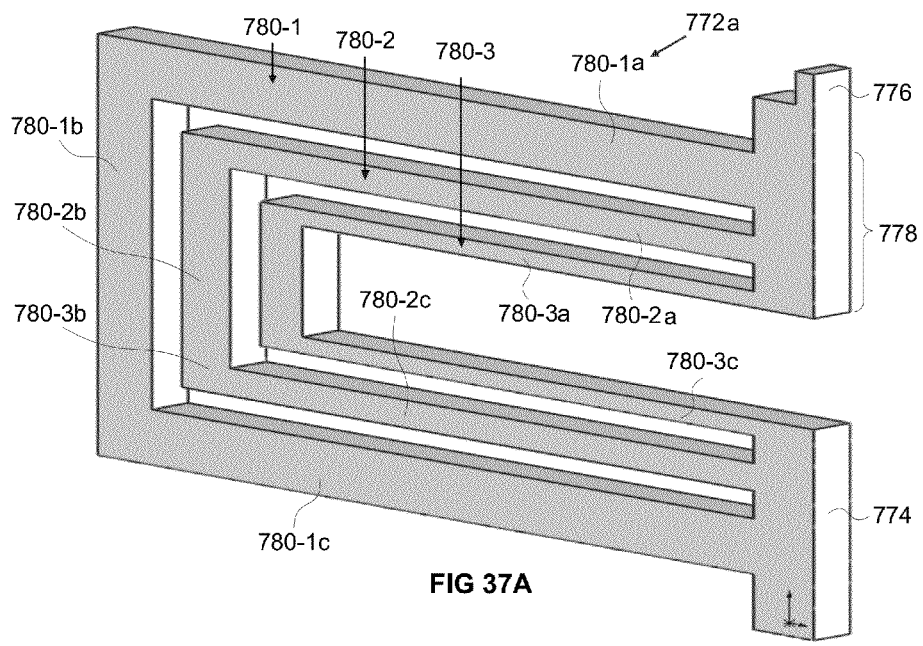
FIGS. 37A-37F provide perspective views of various C-shaped cantilever probe embodiments.

The probe structure 772a of the example of FIG. 37A provides an example of a compound cantilever-like structure with only a forward C-structure support 774 which can be attached to a substrate, a contact or tip region 776 on an upper bridging element 778, and three parallel C-shaped cantilever compliant elements 780-1, 780-2, and 780-3 that attach the upper bridging element 776 and the support structure 774. Each C-shaped cantilever element comprises an upper beam element 780-1a, 780-2a, 780-3a with each connecting at a distal end to upper bridging element 778, and at a proximal end, respectively to proximal bridging elements 780-1b, 780-2b, and 780-3b, respectively. The proximal bridging elements, respectively connect to lower beam elements 780-1c, 780-2c, and 780-3c. Each of these lower beam elements connect to a lower bridging element or support structure 774.

Figure 37B:
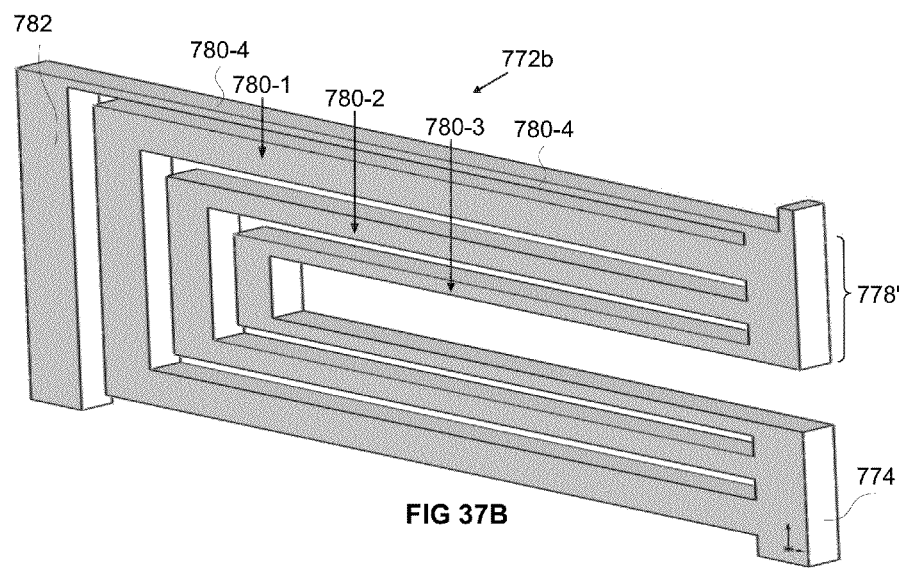

The probe structure 772b of FIG. 37B provides an example of a probe structure similar to that of FIG. 37A with the exception that a rear cantilever support 782 and an upper and extra cantilever element 780-4 connects the rear cantilever support 782 to the upper bridging element 778'. Like elements between FIG. 37A and 37B are identified with like reference numerals.

Figure 37C:
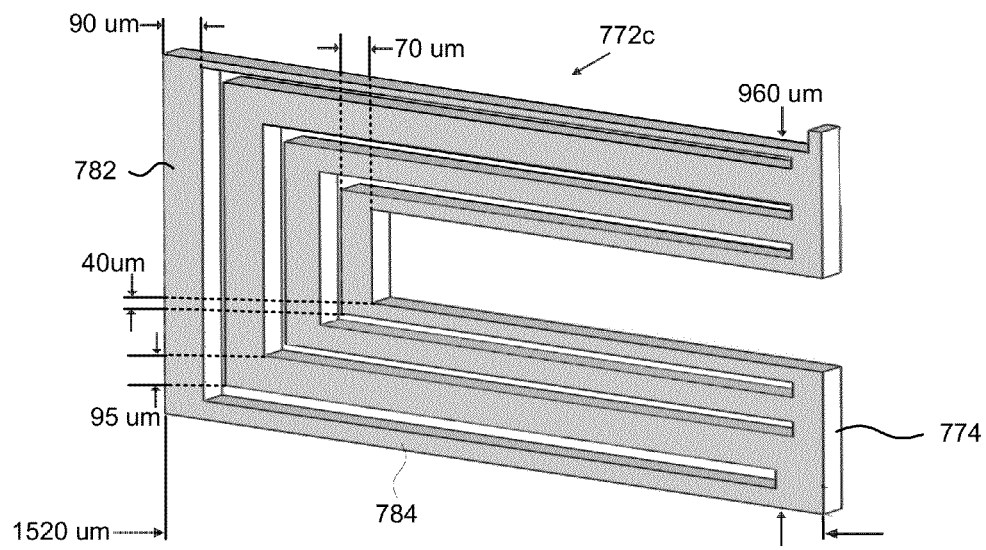

FIG. 37C provides an example of a probe structure 772c similar to that of FIG. 37B with the exception that a base element 784 connects the rear cantilever support 782 to the C-structure support 774. Furthermore some sample dimensions (in microns) provide a rough scale for the probe structure. Like elements among FIGS. 37A-37C are identified with like reference numerals.

Figure 37D:
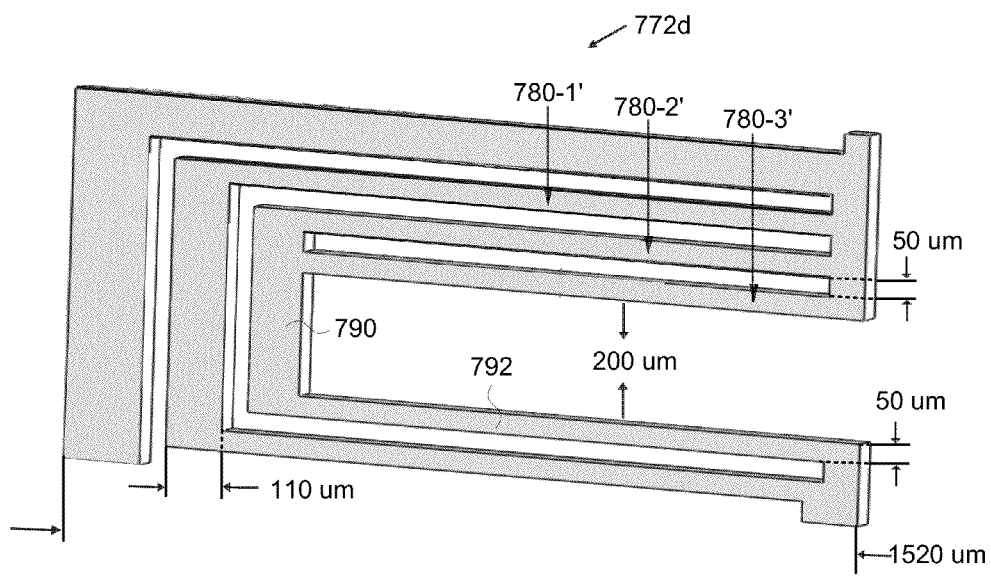

FIG. 37D provides an example of a probe structure 772d similar to that of FIG. 37B with the exception that the C-shaped cantilever elements 780-2 and 780-3 are merged into a common vertical support 790 and share a common horizontal bottom element 792. Furthermore, some sample dimensions (in microns) provide a rough scale for the probe structure. Like elements among FIGS. 37A-37D are identified with like reference numerals.

Figure 37E:
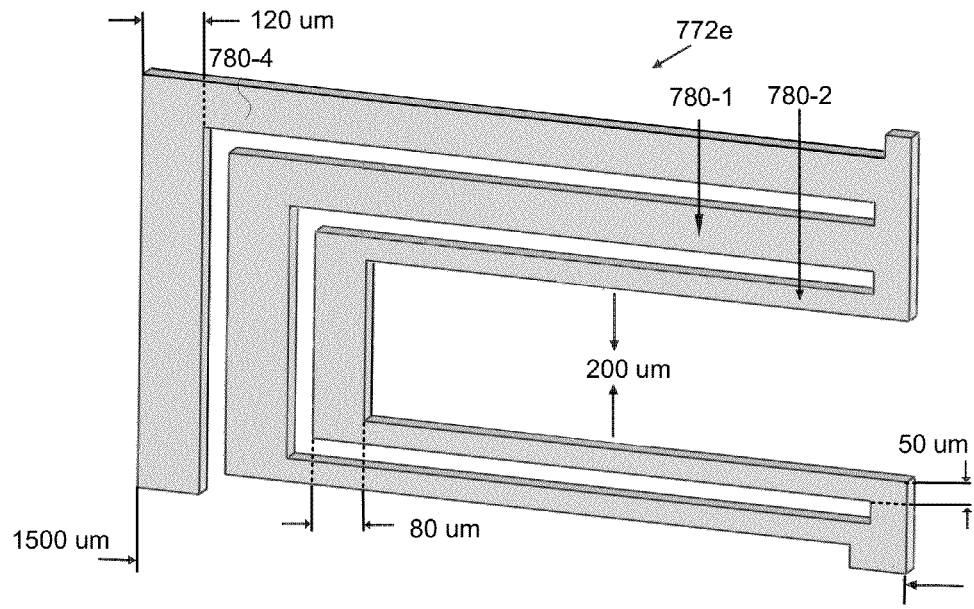

FIG. 37E provides an example of a probe structure 772e similar to that of FIG. 37B with the exception that the C-shaped cantilever element 780-3 of FIG. 37B is removed so that the probe includes a primary cantilever 780-4 and second C-shaped cantilevers 780-1 and 780-2. Furthermore, some sample dimensions (in microns) provide a rough scale for the probe structure. Like elements among FIGS. 37A-37E are identified with like reference numerals.

Figure 37F:
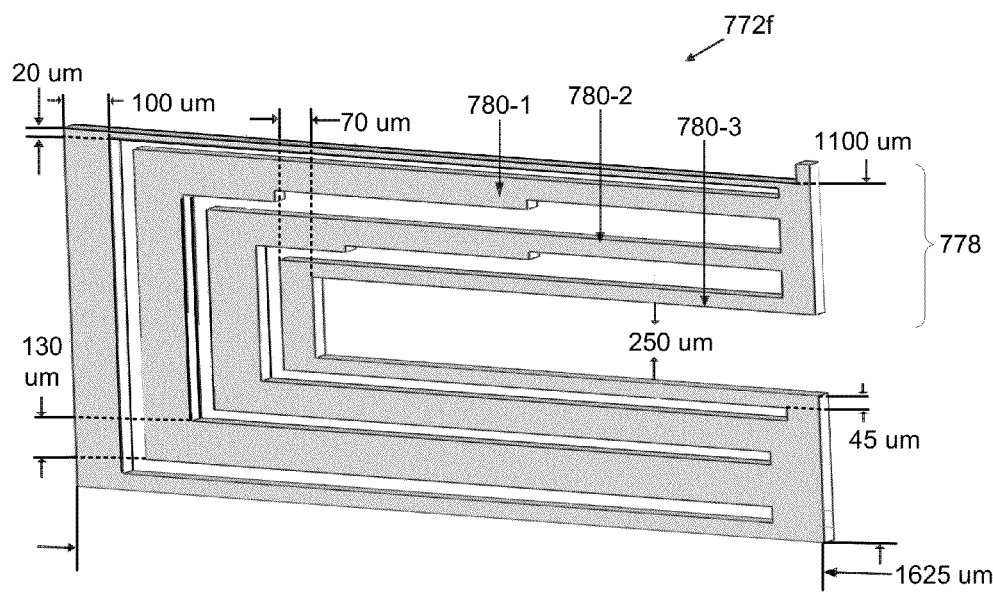

FIG. 37F provides an example of a probe structure 772f similar to that of FIG. 37C with the exception that the upper cantilever portions (i.e. upper beam elements 780-1a, 780-2a) of C-shaped cantilever elements 780-1 and 780-2, respectively have progressively decreasing thicknesses as they approach the upper bridging element 778. Furthermore, some sample dimensions (in microns) provide a rough scale for the probe structure. Like elements among FIGS. 37A-37F are identified with like reference numerals.

Figure 38A:
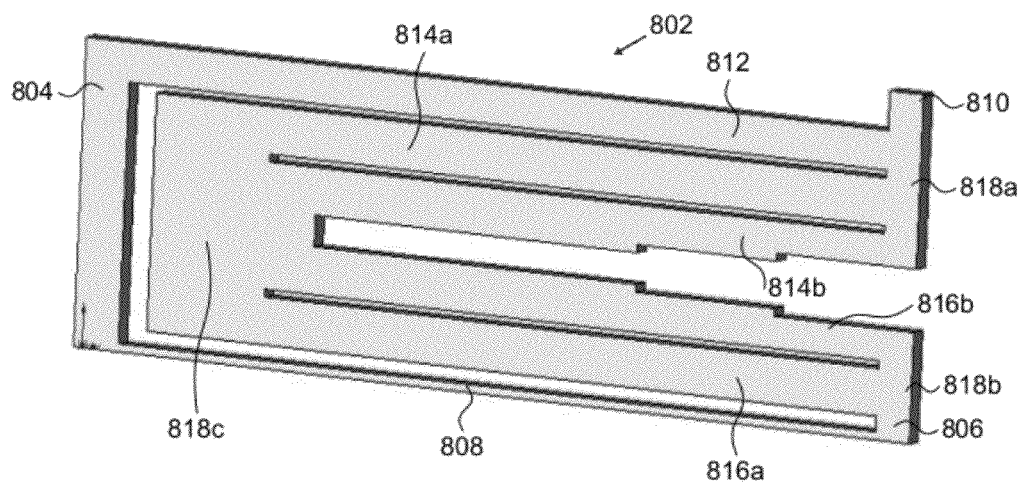
FIGS. 38A-38B provide a perspective view of another C-shaped cantilever probe embodiment and a stress distribution associated with deflecting the probe, respectively.
Figure 38B:
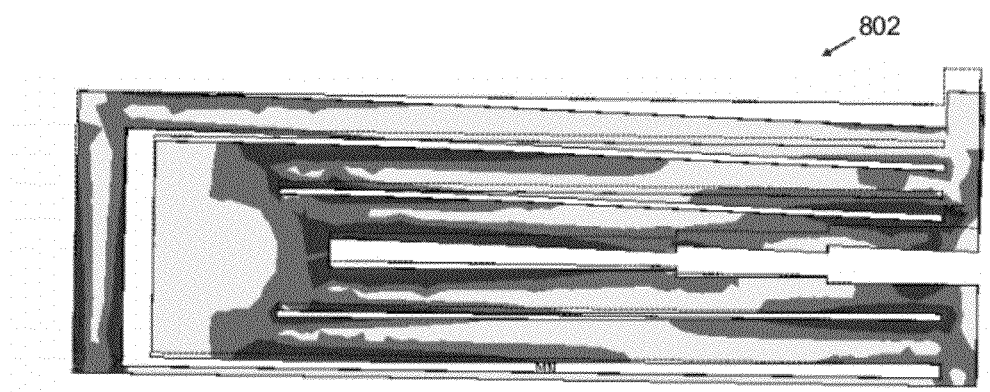

FIGS. 38A and 38B provide a perspective view and a deflected side view of another embodiment of the invention. The probe of FIGS. 38A and 38B has some similarities to that of FIG. 37F. The probe structure 802 of the example of FIGS. 38A and 38B provides a compound cantilever-like structure with a rear cantilever support 804, a forward C-structure support 806, a base 808, a contact region 810, a primary cantilever arm 812, upper S-bending arms 814a and 814b, lower S-bending arms 816a and 816b, and forward upper bridging region 818a, forward lower bridging element 818b (which as illustrated is an extension of support 806. Arms 814a, 814b, 816a and 816b will tend to bend in an s-shape when tip 810 is put under load and is relatively urged toward base 806. In this embodiment a plurality of arms (814a and 814b) contact bridge 818c to form the upper element of a C-shape while a plurality of arms (816a and 816b) contact bridge 818c to form the lower element of a C-shape. This inner end joining of upper and lower arms causes the individual arms of the C-clamp to flex in more of an S-shape than a normal cantilever shape. This tends to stiffen the overall spring response and tends to reduce scrub. In this example, the upper most arm (cantilever arm 812) does not connect to bridging element 818c (i.e. does not form part of the C-Clamp) but instead remains free to convey force to the support end 804 of the base while the elements of the C-clamp tend to direct force to support 806. In other alternative embodiments cantilever arm 812 may be connected directly to a bridging element like 818c. In some alternatives of the present embodiment the inner most gap (formed by arms 814*b*, bridge 818*c*, and arm 816*b* may have an opening with a stepped "V" shape (as shown) which may help distribute stress while also creating more clearance for the top section to compress toward the bottom section of the C-shaped portion of the structure. In other alternative embodiments the inner most portions of the C-clamp may provide other configurations.

FIG. 38B depicts a simulated 40 um deflection of the tip of the structure under a 4 gram load. The structure is 1.5 mm long and 30 um wide. An array of such structures may be formed or placed adjacent to one another (e.g. on a 50 um pitch) to yield a desired contact pattern. The structure may be formed on or bonded to a substrate. For example, adhesion between the structure and the substrate may occur along the length of the base of the structure or alternatively it may occur at one or both of the rear or front support columns.

In other embodiments various other modification are possible. For example heights of post portions of the composite beam may be varied and/or heights of contact regions may be varied. As an additional example, tip structures (not shown) may be added or formed on the ends of the contact regions. As another example lengths of cantilever arms may be changed. As a further example, multiple rear supported cantilever beams may act in parallel with multiple C-shaped cantilever-like structures (e.g. connected to the same tip bridging element). As an even further example, various features of the previously presented embodiments may be combined with one another to form new cantilever probe designs having various properties of the interest and/or enhanced fabrication methods may be achieved for a given probe design.

Figure 39A:
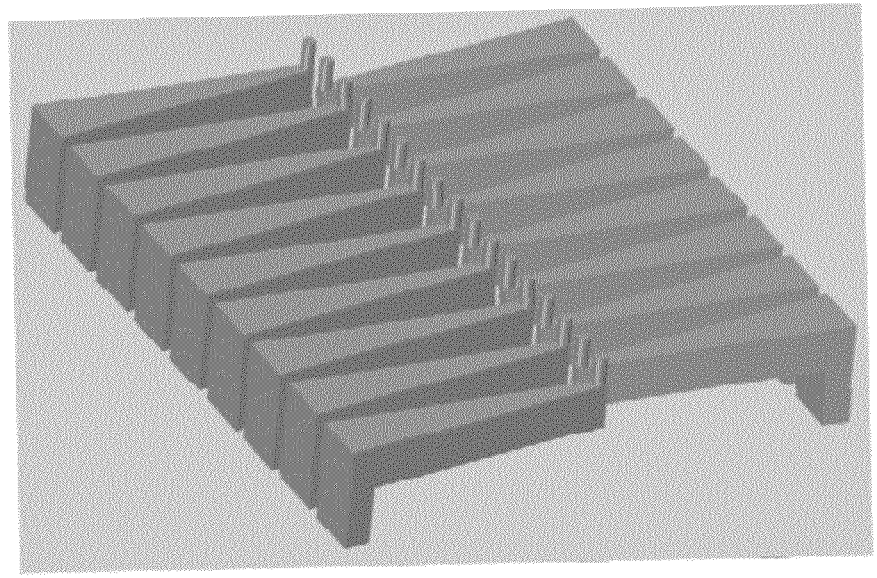
FIGS. 39A-39C provide perspective views of example probe arrays according to some embodiments of the invention.

FIG. 39A provides a perspective view of an array of cantilever probe structures that may be formed according to some embodiments of the invention. The width of these sample probe structures decreases along their cantilever lengths.

Figure 39B:
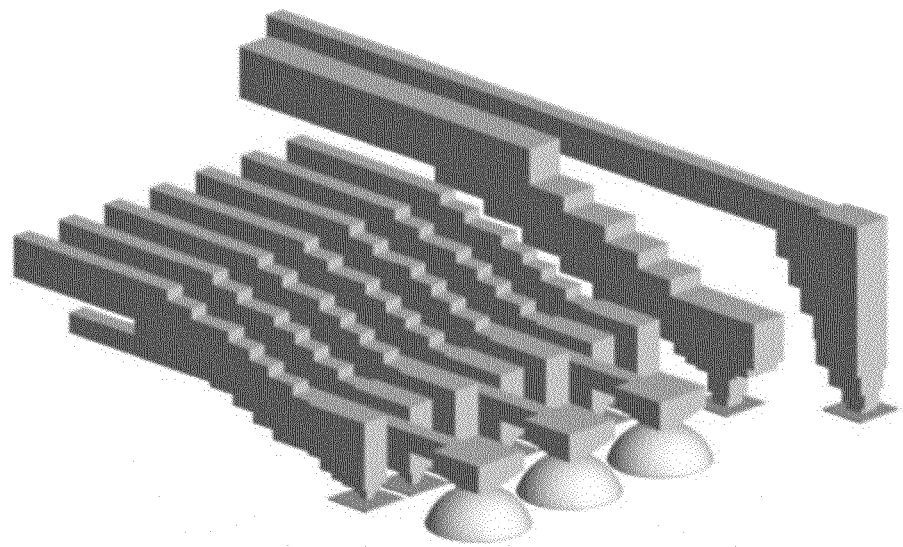

FIG. 39B provides a perspective view of another array of cantilever probe elements (support columns or risers are not shown) which have different contact heights, different approach positions and heights, and different structural sizes and cross-sectional configurations (e.g. which may be useful in providing different current carrying capabilities, different spacing possibilities, different compliances, ability to make electric contact with different types and heights of pads simultaneously), and different probe tip configurations (e.g. which might allow probe tips to be configured to a specific contact situations and materials). Use of probes of varying size, positioning, height and the like may reduce the complexities of power and ground signal duplication.

Figure 39C:
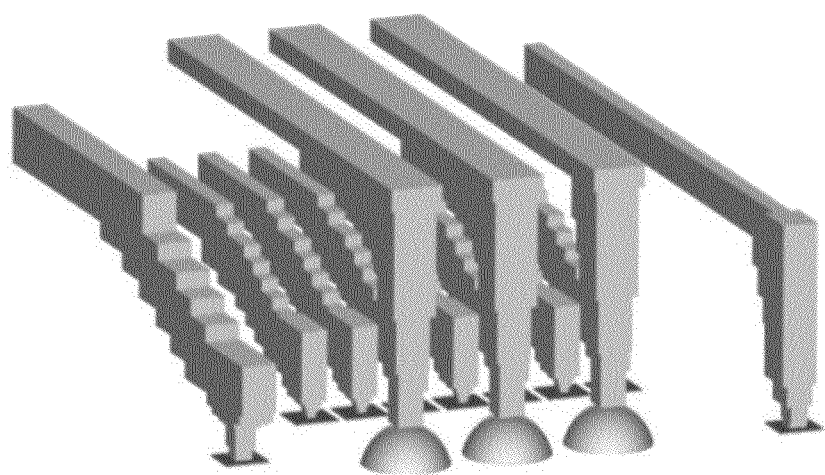

FIG. 39C provides a perspective view of another array of cantilever probe elements (support columns or risers are not shown). In the example of FIG. 39C, the probe elements that reach past other probe elements are not shown as interleaved but instead as coming in above the others. In other probe arrays, any appropriate individual probe elements of desired configurations may be used and be made to contact pads, bumps or other surfaces to be tested.

In various embodiments of the present invention probes may be formed on their permanent substrate while in other embodiments probes may be formed on a sacrificial substrate and then transferred, via one or more steps, to a permanent substrate where transfer may occur individual probe by individual probe, as an entire array, or as separate groups of incomplete arrays. Spacing between transferred probes or array portions may be different than spacing between the probes or array portions as they are formed. In some embodiments, probes may be transferred in groups associated with individual die. When using a sacrificial building material, as used in some embodiments of the present invention, it is possible to form probes on a temporary substrate and transfer them to a permanent substrate (through one or more transfer operations) and have the probes have different contact heights since the sacrificial material may support the different probe positions during formation, and potentially during transfer, after which the sacrificial material may be removed to release the probes.

FIGS. 39D-39J depict various additional examples of cantilever probe designs that may be formed using electrochemical fabrication techniques. These different probe types may be formed simultaneously and have similar heights or they may start or end at different levels.

Figures 40A, 40B, 40C:
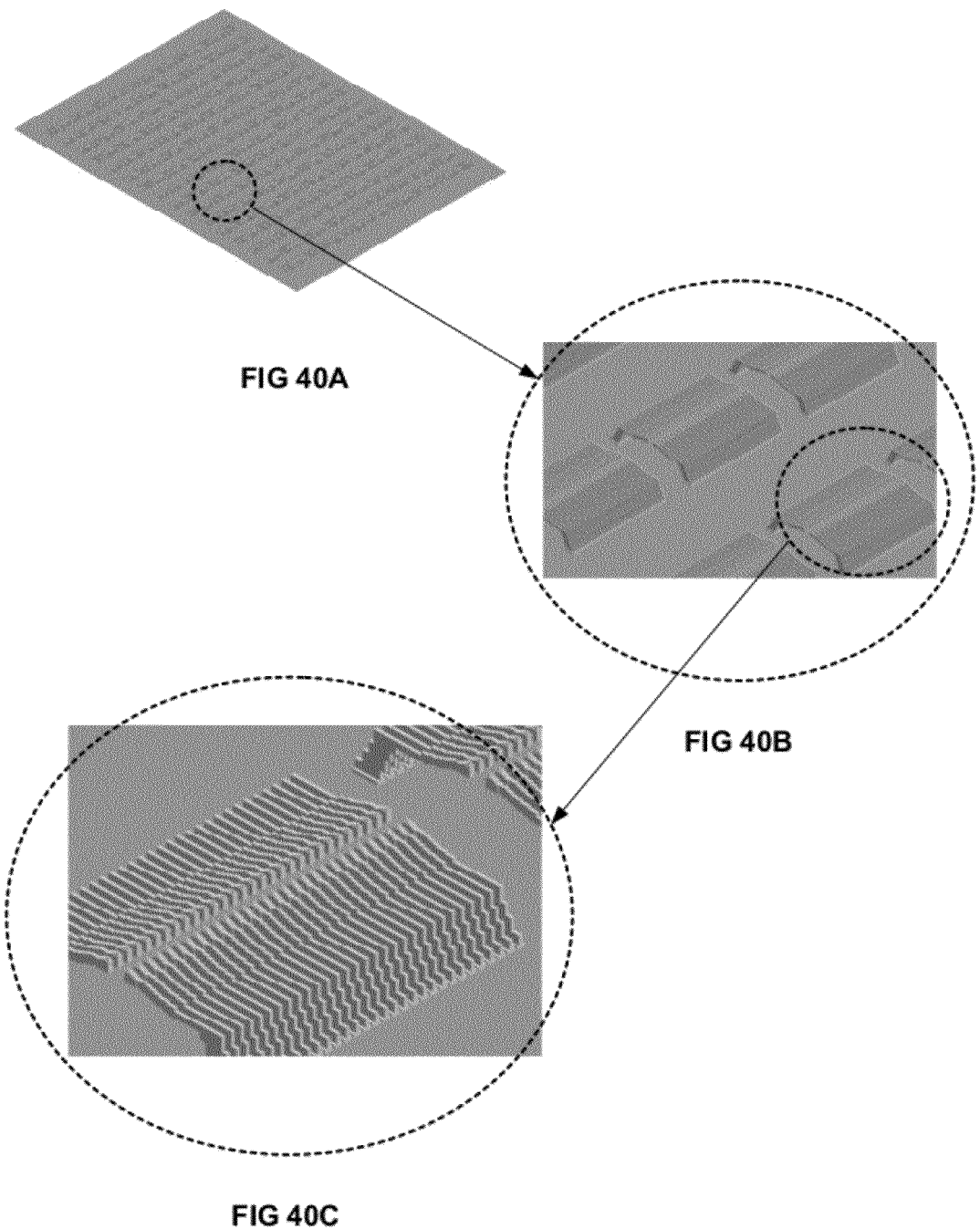
FIGS. 40A-40C provide perspective views of a sample cantilever probe array at different levels of magnification.

FIG. 40A-40C provide perspective views of another array of probe elements that might actually be considered multiple arrays of elements forming a super array. The probes are cantilever type probes and they are arranged in groups. Groups of probe arrays such as depicted may, for example, have application in the area of memory chip testing.

Figure 41:
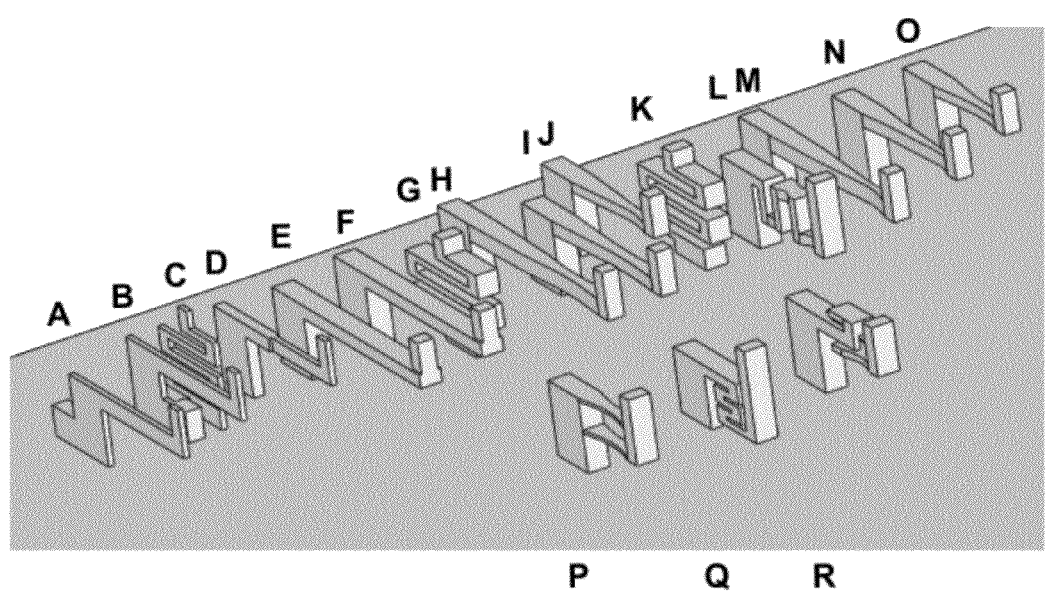
FIGS. 41A-41R provide perspective views of various cantilever probe structures according to some embodiments of the invention.

FIGS. 41A-41R depict a variety of different cantilever probe structures according to various embodiments of the invention. These cantilever probe structures may be formed using electrochemical fabrication techniques or they may be formable using other fabrication methods.

Tapered probes such as those shown in FIGS. 41M, 41N, 41O, and 41P may be used to disperse stress more uniformly through out a structure and thereby lower maximum stress level and thereby increase probe reliability and life.

FIG. 42A depicts an example of an alternative cantilever probe embodiment. In the embodiment of FIG. 42A, the cantilever probe 822 includes a beam section 824 having a contact tip region 826 and at least two compliant support structures 828-1 and 828-2, where the support structure 828-1 that is distal from the tip region is less compliant than the support structure 828-2 which is located closer to the tip. In other alternatives more than two compliant support structures may be used. In still other embodiments, any of a variety of compliant structures may be used as support structures.

FIG. 42B depicts another alternative cantilever probe structure. Cantilever probe structures of this type may be considered to be a "tensional cantilevers" as opposed to a "compressional cantilevers" since the compliant element of the cantilever is placed under tension instead of under compression. As illustrated the cantilever 832 includes a beam structure 834 which is connected to a compliant structure 836 on or near one end and has a tip 838 on or near the opposite end. The structure also includes a substantially non-compliant pivot structure 840. During operation the tip 838 is pressed downward toward substrate causing compliant element 836 to bend and after the beam 834 contacts the pivot structure 840, continued downward movement of the tip causes the compliant structure 836 to be placed in tension. In some alternative embodiments, the pivot structure may have a curved or pointed upper surface, and/or the beam 834 may remain in contact with the pivot structure even when no load is placed on the tip. In some alternative embodiments the pivot bar and cantilever bar may be pinned together as shown in FIG. 43A where the pivot structure 840' may hold a pin 842 that extends into cantilever bar 834 (the compliant structure and probe tip are not shown). In some variations of this embodiment, the pin, the pivot structure and the cantilever arm may be formed simultaneously in their desired positions. In some embodiments side supports 844R and 844L may retain the pivot structure 840" and cantilever bar 834 in desired positions as shown in FIG. 43B. In still other alternative embodiments the side supports 844' may be attached to the cantilever bar 834 as opposed to the pivot structure 840''' as shown in FIG. 43C.

In other variations of the tensional cantilever, the effective spring constant of the compliant structure may be increased or decreased by changing the ratio (CP/TP) of distances from the compliant structure to the pivot structure (CP) and from the tip to the pivot structure (TP). If the ratio is greater than one (i.e. the compliant structure is further form the pivot structure than the probe tip) the effective spring constant is increased. If on the other hand the ratio is less than one, the effective spring constant is decreased. Similarly, if the ratio is greater than one, the useable over-travel is decreased, whereas if the ratio is less than one, the useable over-travel of the probe is greater than the over travel capability of the compliant element alone.

Pivoting cantilever structures may also be used in compression when the compliant element and the probe tip are on the same side of the pivot structure. Such probe structures may be used to enhance the effective compliance and effective over travel capabilities of a compliant structure (i.e. the actual compliance and over travel of the probe as a whole). If the CP/TP ratio is greater than one the effective compliance decreases and the over travel capabilities also decrease. On the other hand, if the ratio is less than one, the compliance and the over travel capabilities of the probe are enhanced.

Figure 44A:
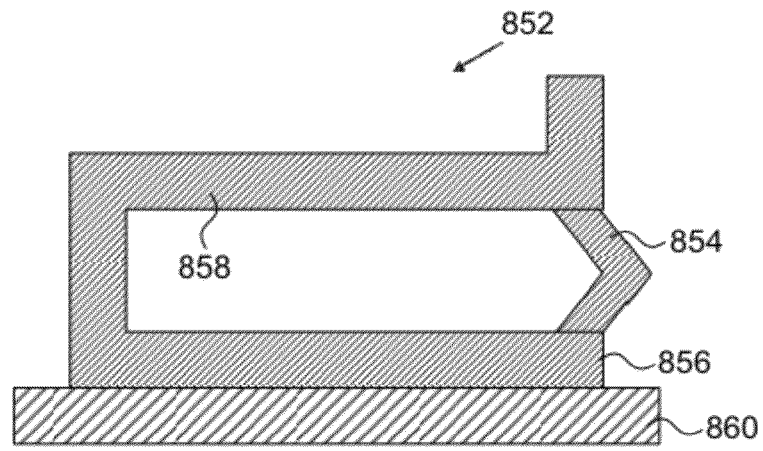
FIGS. 44A-44C provide examples of cantilever structures have added compliant elements.
Figure 44B:
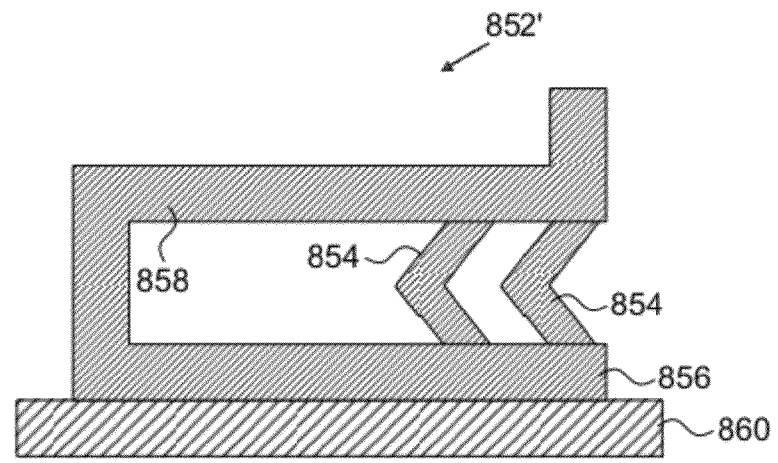
Figure 44C:
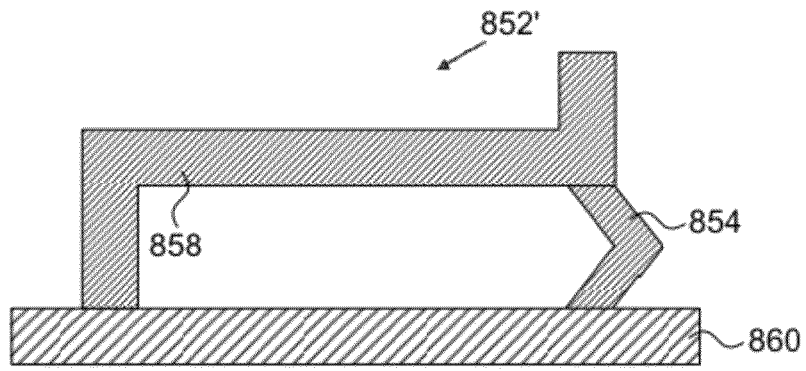

In still other alternative embodiments, additional compliant structures may be added in parallel to a cantilever probe which will increase the stiffness of the probe. Examples of such structures are provided in FIGS. 44A-44C. FIG. 44A adds a single compliant structure 854 to a cantilever structure 852. FIG. 44B adds two compliant structures 854 to a cantilever structure 852'. In both FIG. 44A and 44B the compliant structures were added between an extended base 856 and the cantilever arm 858 itself. In FIG. 44C a compliant structure is added below the cantilever structure 858 and mount directly to a substrate 860. In other alternative embodiments, the cantilever structures may take on any of a variety of forms (e.g. the various forms set forth in other embodiments herein). In still other alternative embodiments, the added compliant structures may take on any of a variety of forms (e.g. the various forms set forth in the other embodiments herein or in embodiments set forth in one or more of the other patent applications incorporated herein by reference). The extra spring constant added by the addition of one or more added compliant elements may be useful in some embodiments where it is not possible to make all cantilevers have the same effective length but where it is still desired that each have a similar effective compliance.

In forming cantilever probes using electrochemical fabrication techniques there may be a minimum width for the probes or a minimum spacing between probes (i.e. minimum feature size) that may make it difficult to achieve desired pitch placements. Such minimums are sometimes layer thickness dependent (e.g. the smaller the layer thickness the smaller the minimum feature size). Many cantilevers for use in probing DRAMs are preferably hundreds of microns tall, which encourages one to use layer thicknesses as large as possible (e.g. 50 um tall layers). But this also results in large minimum feature sizes (e.g. 50 um widths). This in turn puts a limit on the pitch of probe structures based on a need of each probe to be separated by a gap (e.g. 100 micron center-line-to-center-line spacing). In some embodiments it may be possible to achieve improved pitch (i.e. decreased pitch) by forming a portion of cantilever probe structures using thinner layers which can have smaller minimum features sizes. Improved pitch may be achieved for example by staggering the cantilevers (with every other probe coming from the opposite direction and by using the thinner layers (e.g. 12 um thick layers) for the last few layers of the tip or before the tip.

Figure 45A:
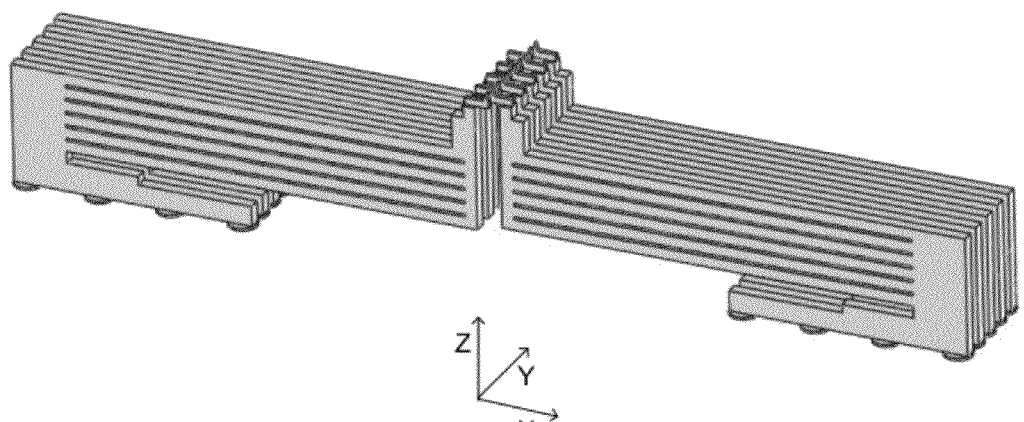
FIGS. 45A-45B provide perspective views, at two different magnifications, of a sample probe array that may be formed initially using thick layers and finally using thin layers to allow desired placement of critical structures.
Figure 45B:
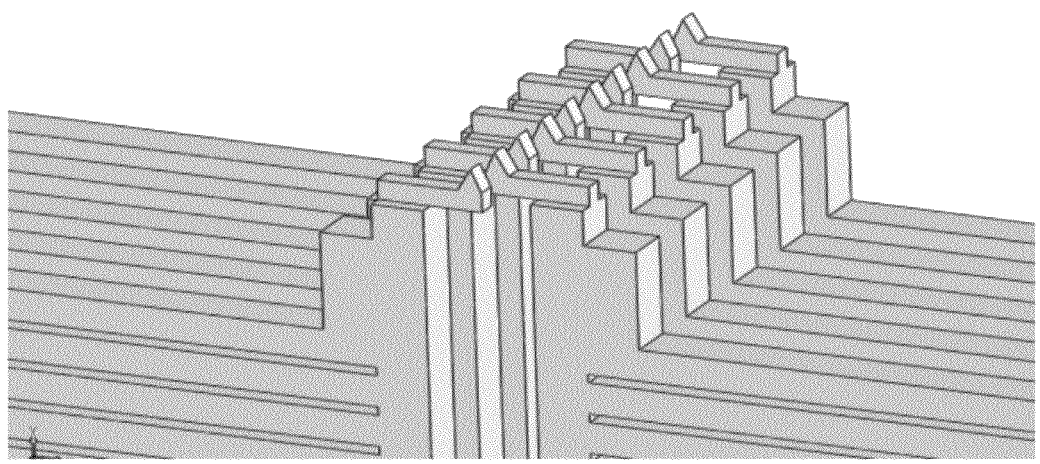

An example of this embodiment is shown in FIGS. 45A-45B which provide perspective views (full view FIG. 45A and close up of tips FIG. 45B) of a cantilever array having probe tips located on a common line where the body of the cantilever is made of 50 micron thick layers, stacked one on the other in the z-direction, and a 50 micron minimum feature size and where the top few layers are made from 20 micron layers and thus can be made to come into closer proximity to each other and thus can be located side by side so that tips may be made co-linear. Embodiments of this type allow probe arrays or other structures to be formed with appropriate (i.e. fine or high resolution) feature sizes in critical areas while simultaneously minimizing the number of layers that are used in forming the structures.

Figure 46A:
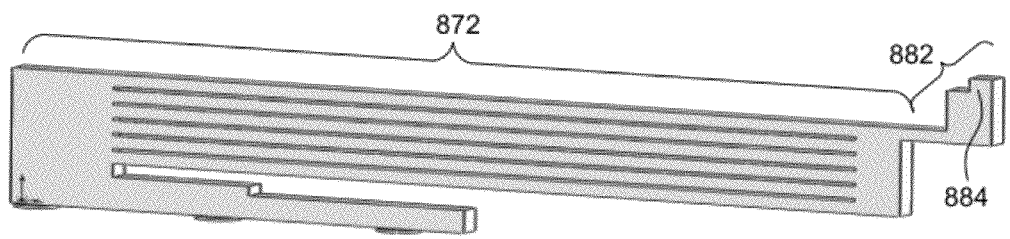
FIGS. 46A and 46B provide perspective views of a cantilever probe design having a small cantilever located on a larger cantilever such that the large cantilever provides most vertical compression while the small cantilever provides significant scrubbing displacement.
Figure 46B:
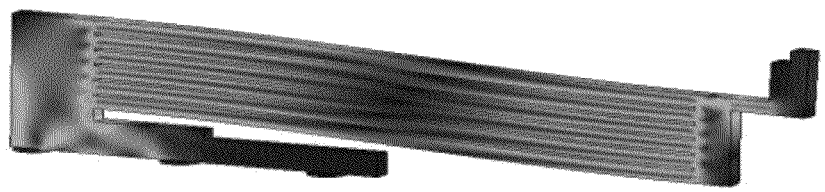

Multi beam probes as discussed herein above provide a very high overtravel for their lengths but tend to offer minimal scrub length (length of horizontal movement which causes scratching through any oxide or other contaminates that may hinder the ability to achieve good electrical contact between a probe and a target surface). In some embodiments, enhanced tip structures may be used to improve scrub length. In some such embodiments, a small cantilever may be placed at the end of a larger cantilever. The compliance of the small cantilever is preferably set, or its over travel is limited, so that it does not exceed a stress level which could damage it but bends enough to provide additional scrub. One such embodiment is illustrated in FIGS. 46A and 46B. A small cantilever 882, having probe tip 884 is mounted at the distal end of a larger cantilever 872. The large cantilever provides most of the vertical compliance while the smaller cantilever contributes significantly to scrubbing. In one example, scrubbing increased from 7 to 12 um by the addition of the small cantilever while not sacrificing maximum stress level.

Figure 46C:
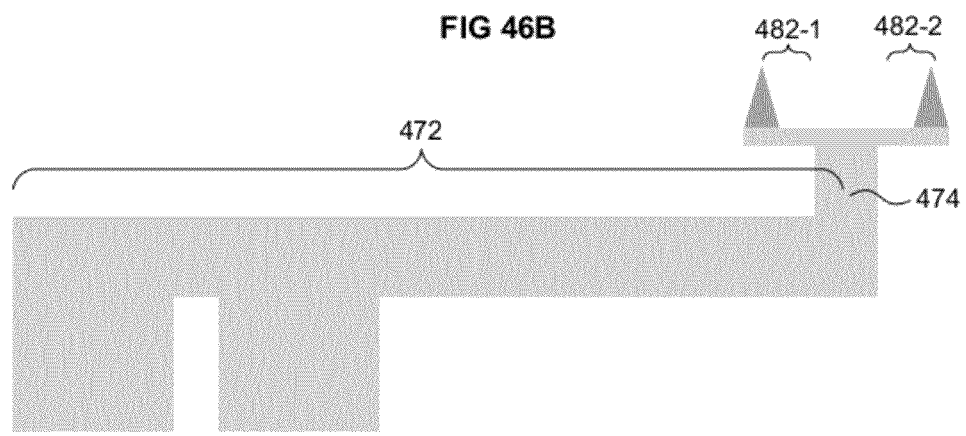
FIGS. 46C-46E provides three side views of two small cantilevers located on a larger cantilever where it is believed that the two small cantilevers can aid in achieving adequate scrubbing during vertical compression of the probe.
Figure 46D:
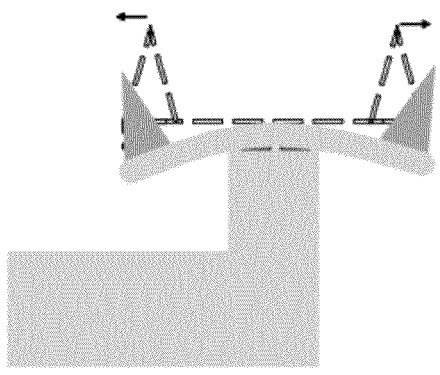
Figure 46E:
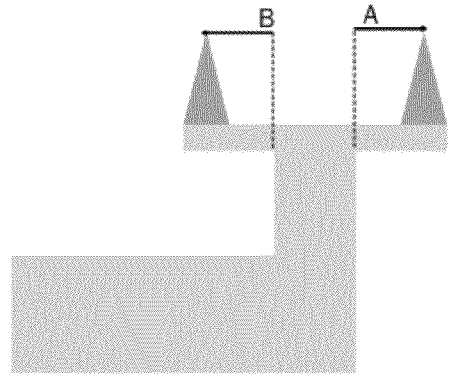

In another embodiment, a multi-tip small cantilever may be used on a larger cantilever as illustrated in FIGS. 46C-46E. Large cantilever 472' has located on its distal end a non-contact tip structure 474 on which two smaller cantilevers 482-1 and 482-2 are mounted. FIG. 46D illustrates the scrubbing action that can occur under compression. FIG. 46E indicates that the relative lengths of the small cantilevers are A and B respectively. The ratio of A and B may dictate or at least contribute to the relative amount of scrubbing performed by each tip.

In some embodiments of the invention special tip structures may be bonded to fabricated cantilevers or alternatively cantilevers may be formed upside down and the cantilever structure may be formed on the tip as build up begins. In still other embodiments, tip coating material may be deposited onto the tip portion of the cantilever or onto the whole cantilever after it is formed. In still other embodiments, material deposited and patterned during formation of the cantilever may be used as tip material. For example the layer, or layers, of the cantilever may be considered the tip and these layers may simply be made from tip material.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multi-layer Structures Having Improved Interlayer Adhesion" and which is hereby incorporated herein by reference as if set forth in full.

Further teachings about microprobes and electrochemical fabrication techniques are set forth in a number of U.S. patent applications: (1) U.S. patent application No. 60/533,975 by Kim et al., which was filed on Dec. 31, 2003, and which is entitled "Microprobe Tips and Methods for Making"; (2) U.S. patent application No. 60/533,947 by Kumar et al., which was filed on Dec. 31, 2003, and which is entitled "Probe Arrays and Method for Making"; (3) U.S. patent application No. 60/574,737 by Cohen et al., which was filed May 26, 2004, and which is entitled "Electrochemical Fabrication Method for Fabricating Space Transformers or Co-Fabricating Probes and Space Transformers"; (4) U.S. patent application No. 60/533,897 by Cohen et al. which was filed on Dec. 31, 2003, and which is entitled "Electrochemical Fabrication Process for Forming Multilayer Multimaterial Microprobe structures"; (5) U.S. patent application No. 60/540,511 by Kruglick et al, which was filed on Jan. 29, 2004, and which is entitled "Electrochemically Fabricated Microprobes", (6) U.S. patent application Ser. No. 10/772,943, by Arat et al., now abandoned, which was filed Feb. 4, 2004, and which is entitled "Electrochemically Fabricated Microprobes"; (7) U.S. patent application No. 60/582,690, filed Jun. 23, 2004, by Kruglick, and which is entitled "Cantilever Microprobes with Base Structures Configured for Mechanical Interlocking to a Substrate"; and (8) U.S. patent application No. 60/582,689, filed Jun. 23, 2004 by Kruglick, and which is entitled "Cantilever Microprobes with Improved Base Structures and Methods for Making the Same". These patent filings are each hereby incorporated herein by reference as if set forth in full herein. The techniques disclosed explicitly herein may also benefit by combining them with the techniques disclosed in U.S. patent application Ser. No. 11/029,180, filed Jan. 3, 2005, by Chen et al., now abandoned, and entitled "Pin-Type Probes for Contacting Electronic Circuits and Methods for Making Such Probes"; U.S. patent application No. 60/641,341 filed Jan. 3, 2005, by Chen et al. and entitled "Vertical Microprobes for Contacting Electronic Components and Method for Making Such Probes"; U.S. patent application Ser. No. 11/029,217, filed Jan. 3, 2005, now U.S. Pat. No. 7,412,767, issued Aug. 19, 2008, by Kim et al. and entitled "Microprobe Tips and Methods For Making"; U.S. patent application Ser. No. 11/028,958, Jan. 3, 2005, by Kumar et al., now abandoned, and entitled "Probe Arrays and Methods for Making"; and U.S. patent application Ser. No. 11/029,221, filed Jan. 3, 2005, now U.S. Pat. No. 7,531,077, issued May 12, 2009, by Cohen et al. and entitled "Electrochemical Fabrication Process for Forming Multilayer Multimaterial Microprobe Structures".

Further teachings about planarizing layers and setting layers thicknesses and the like are set forth in the following U.S. patent applications which were filed Dec. 31, 2003: (1) U.S. patent application No. 60/534,159 by Cohen et al. and which is entitled "Electrochemical Fabrication Methods for Producing Multilayer Structures Including the Use of Diamond Machining in the Planarization of Deposits of Material" and (2) U.S. patent application No. 60/534,183 by Cohen et al. and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein. The techniques disclosed explicitly herein may also benefit by combining them with the techniques disclosed in U.S. patent application Ser. No. 11/029,220, filed Jan. 3, 2005, now U.S. Pat. No. 7,271,888, issued Sept. 18, 2007, by Frodis et al. and entitled "Method and Apparatus for Maintaining Parallelism of Layers and/or Achieving Desired Thicknesses of Layers During the Electrochemical Fabrication of Structures".

Additional teachings concerning the formation of structures on dielectric substrates and/or the formation of structures that incorporate dielectric materials into the formation process and possibility into the final structures as formed are set forth in a number of patent applications: (1) U.S. patent application No. 60/534,184, by Cohen, which as filed on Dec. 31, 2003, and which is entitled "Electrochemical Fabrication Methods Incorporating Dielectric Materials and/or Using Dielectric Substrates"; (2) U.S. patent application No. 60/533,932, by Cohen, which was filed on Dec. 31, 2003, and which is entitled "Electrochemical Fabrication Methods Using Dielectric Substrates"; (3) U.S. patent application No. 60/534,157, by Lockard et al., which was filed on Dec. 31, 2003, and which is entitled "Electrochemical Fabrication Methods Incorporating Dielectric Materials"; (4) U.S. patent application No. 60/574,733, by Lockard et al., which was filed on May 26, 2004, and which is entitled "Methods for Electrochemically Fabricating Structures Using Adhered Masks, Incorporating Dielectric Sheets, and/or Seed Layers that are Partially Removed Via Planarization"; and U.S. patent application No. 60/533,895, by Lembrikov et al., which was filed on Dec. 31, 2003, and which is entitled "Electrochemical Fabrication Method for Producing Multilayer Three-Dimensional Structures on a Porous Dielectric". These patent filings are each hereby incorporated herein by reference as if set forth in full herein. The techniques disclosed explicitly herein may also benefit by combining them with the techniques disclosed in U.S. patent application Ser. No. 11/029,216, filed Jan. 3, 2005, by Cohen et al., now abandoned, entitled "Electrochemical Fabrication Methods Incorporating Dielectric Materials and/or Using Dielectric Substrates" and U.S. patent application No. 60/641,292, filed Jan. 3, 2005, by Dennis R. Smalley, and entitled "Method of Forming Electrically Isolated Structures Using Thin Dielectric Coatings".

The patent applications and patents set forth below are hereby incorporated by reference herein as if set forth in full. The teachings in these incorporated applications and patents can be combined with the teachings directly set forth in the instant application in many ways: For example, enhanced methods of producing structures may be derived from some combinations of teachings, enhanced structures may be obtainable, enhanced apparatus may be derived, and the like.

| US Pat App No, Filing Date US App Pub No, Pub Date | Inventor, Title |
| --- | --- |
| 09/493,496 - Jan. 28, 2000 PAT 6,790,377 - Sep. 14, 2004 | Cohen, "Method For Electrochemical Fabrication" |
| 10/677,556 - Oct. 1, 2003 2004-0134772 - Jul. 15, 2004 | Cohen, "Monolithic Structures Including Alignment and/or Retention Fixtures for Accepting Components" |
| 10/830,262 - Apr. 21, 2004 2004-0251142A - Dec. 16, 2004 PAT 7,198,704 - Apr. 3, 2007 | Cohen, "Methods of Reducing Interlayer Discontinuities in Electrochemically Fabricated Three-Dimensional Structures" |

-continued

| US Pat App No, Filing Date US App Pub No, Pub Date | Inventor, Title |
|---|---|
| 10/271,574 - Oct. 15, 2002 2003-0127336A - Jul. 10, 2003 PAT 7,288,178 - Oct. 30, 2007 | Cohen, "Methods of and Apparatus for Making High Aspect Ratio Microelectromechanical Structures" |
| 10/697,597 - Dec. 20, 2002 2004-0146650A - Jul. 29, 2004 | Lockard, "EFAB Methods and Apparatus Including Spray Metal or Powder Coating Processes" |
| 10/677,498 - Oct. 1, 2003 2004-0134788 - Jul. 15, 2004 PAT 7,235,166 - Jun. 26, 2007 | Cohen, "Multi-cell Masks and Methods and Apparatus for Using Such Masks To Form Three-Dimensional Structures" |
| 10/724,513 - Nov. 26, 2003 2004-0147124 - Jul. 29, 2004 PAT 7,368,044 - May 6, 2008 | Cohen, "Non-Conformable Masks and Methods and Apparatus for Forming Three-Dimensional Structures" |
| 10/607,931 - Jun. 27, 2003 2004-0140862 - Jul. 22, 2004 PAT 7,239,219 - Jul. 3, 2007 | Brown, "Miniature RF and Microwave Components and Methods for Fabricating Such Components" |
| 10/841,100 - May 7, 2004 2005-0032362 - Feb. 10, 2005 PAT 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179 A - Dec. 25, 2003 PAT 7,229,542 - Jun. 12, 2007 | Bang, "Methods of and Apparatus for Molding Structures Using Sacrificial Metal Patterns" |
| 10/434,103 - May 7, 2004 2004-0020782A - Feb. 5, 2004 PAT 7,160,429 - Jan. 9, 2007 | Cohen, "Electrochemically Fabricated Hermetically Sealed Microstructures and Methods of and Apparatus for Producing Such Structures" |
| 10/841,006 - May 7, 2004 2005-0067292 - May 31, 2005 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 PAT 7,252,861 - Aug. 7, 2007 | Smalley, "Methods of and Apparatus for Electrochemically Fabricating Structures Via Interlaced Layers or Via Selective Etching and Filling of Voids" |
| 10/724,515 - Nov. 26, 2003 2004-0182716 - Sep. 23, 2004 PAT 7,291,254 - Nov. 6, 2007 | Cohen, "Method for Electrochemically Forming Structures Including Non-Parallel Mating of Contact Masks and Substrates" |
| 10/841,347 - May 7, 2004 2005-0072681 - Apr. 7, 2005 | Cohen, "Multi-step Release Method for Electrochemically Fabricated Structures" |
| 60/533,947 - Dec. 31, 2003 | Kumar, "Probe Arrays and Method for Making" |
| 10/841,300 - May 7, 2004 2005 0032375 - Feb. 10, 2005 | Cohen, "Methods for Electrochemically Fabricating Structures Using Adhered Masks, Incorporating Dielectric Sheets, and/or Seed layers That Are Partially Removed Via Planarization" |
| 60/534,183 - Dec. 31, 2003 | Cohen, "Method and Apparatus for Maintaining Parallelism of Layers and/or Achieving Desired Thicknesses of Layers During the Electrochemical Fabrication of Structures" |
| 11/733,195 - Apr. 9, 2007 2008-0050524 - Feb. 28, 2008 | Kumar, "Methods of Forming Three-Dimensional Structures Having Reduced Stress and/or Curvature" |
| 11/506,586 - Aug. 8, 2006 2007-0039828 - Feb. 22, 2007 PAT 7,611,616 - Nov. 3, 2009 | Cohen, "Mesoscale and Microscale Device Fabrication Methods Using Split Structures and Alignment Elements" |
| 10/949,744 - Sep. 24, 2004 2005-0126916 - Jun. 16, 2005 PAT 7,498,714 - Mar. 3, 2009 | Lockard, "Three-Dimensional Structures Having Feature Sizes Smaller Than a Minimum Feature Size and Methods for Fabricating" |

Various other embodiments of the present invention exist. Some embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may use photoresist, polyimide, glass, ceramics, other polymers, and the like as dielectric structural materials.

It will be understood by those of skill in the art that additional operations may be used in variations of the above presented fabrication embodiments. These additional operations may, for example, perform cleaning functions (e.g. between the primary operations discussed above), they may perform activation functions and monitoring functions.

It will also be understood that the probe elements of some aspects of the invention may be formed with processes which are very different from the processes set forth herein and it is not intended that structural aspects of the invention need to be formed by only those processes taught herein or by processes made obvious by those taught herein.

Many other alternative embodiments will be apparent to those of skill in the art upon review of the teachings herein. Further embodiments may be formed from a combination of the various teachings explicitly set forth in the body of this application. Even further embodiments may be formed by combining the teachings set forth explicitly herein with teachings set forth in the various applications and patents referenced herein, each of which is incorporated herein by reference.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A method of creating a probe structure for contacting a first electronic components wherein the probe structure comprises a contact tip for contacting the first electronic component and a compliant body, the method comprising:
   a) forming at least a portion of the compliant body and the contact tip from one or more multiple material layers of electrodeposited material, wherein during formation of each multiple material layer at least one of the multiple materials is at least one structural material and wherein at least another one of the multiple materials is at least one sacrificial material and wherein at least a plurality of the multiple materials are planarized to set a boundary level for each of the one or more multiple material layers; and
   b) after forming the compliant body and the contact tip, releasing the at least one structural material from the at least one sacrificial material to reveal the probe structure formed from the at least one structural material, wherein the at least one structural material forming the compliant body comprises at least one material that is different from the at least one structural material forming the contact tip,
   wherein each successive layer is formed on the simultaneously adhered to a previously formed layer; and
   wherein the compliant body provides for elastic compression of the probe structure in a plane of primary motion when making contact with the first electronic component and wherein during formation of the probe structure, a stacking direction of layers forming the probe structure is perpendicular to the plane of primary motion.

2. The method of claim 1 wherein a material forming a contact portion of the contact tip is different from any material forming the compliant body.

3. The method of claim 1 wherein the probe structure comprises a cantilever probe structure and at least one feature selected from the group consisting of: (1) a cantilever element consisting of a single cantilever beam; (2) a cantilever element comprising a plurality of cantilever beams; (3) an extended base portion that extends between a cantilever element and a surface of a second electronic component and allows for contacting a surface of the second electronic component; (4) a configuration including a primary beam and at least one additional beam that joins the primary beam and connects to an elongated base via a support element that is different from a support element that connects the primary beam to the elongated base.

4. The method of claim 1 wherein the probe structure comprises a cantilever probe structure comprising a plurality of beam elements wherein at least part of each of the plurality of beam elements are formed within a single multiple material layer.

5. The method of claim 1 wherein the method of creating the probe structure simultaneously creates a plurality of probe structures in a batch process on a substrate over which a release layer is formed and onto which the multiple materials are deposited.

6. The method of claim 5 wherein a plurality of probes are attached to a second electronic component in a desired configuration and wherein the contact tips are made to at least temporarily contact the first electronic component to provide an electrical connection between the first and second electronic components.

7. The method of claim 1 wherein the one or more multiple material layers from which the compliant body is formed comprise a plurality of layers and wherein the one or more multiple material layers from which the contact tip is formed is or are the same as the multiple material layers from which the compliant body is formed.

8. A method of creating a probe structure for contacting a first electronic component wherein the probe structure comprises a contact tip for contacting the first electronic component and a compliant body, the method comprising:
   a. forming at least part of the compliant body;
   b. forming the contact tip;
   wherein the forming of each of the compliant body and the contact tip comprise forming one or more multiple material layers of electrodeposited material, wherein at least one of the multiple materials is at least one structural material and wherein at least another one of the multiple materials is at least one sacrificial material and wherein at least a plurality of the multiple materials are planarized to set a boundary level for each layer, wherein the compliant body and the contact tip are each formed from at least one structural material deposited during the formation of their respective layer or layers, and
   c. after forming the compliant body and the contact tip, releasing the at least one structural material from the at least one sacrificial material to reveal the probe structure formed from the at least one structural material;
   wherein successive layers are successively formed on adhered to previously formed layers;
   wherein the at least one structural material forming the compliant body portion of the probe comprises at least one material that is different from at least one structural material forming the contact tip;
   wherein the compliant body provides for elastic compression of the probe structure in a plane of primary motion when making contact with the first electronic component and wherein during formation of the probe structure, a stacking direction of layers forming the probe structure is perpendicular to the plane of primary motion.

9. The method of claim 8 wherein a material forming a contact portion of the contact tip is different from any material forming the the compliant body.

10. The method of claim 9 wherein the probe structure comprises a cantilever probe structure comprising at least one feature selected from the group consisting of: (1) a cantilever element consisting of a single cantilever beam; (2) a cantilever element comprising a plurality of cantilever beams; (3) an extended base portion that extends between a cantilever element and a surface of a second electronic component and allows for contacting a surface of the second component; (4) a configuration including a primary beam and at least one additional beam that joins the primary beam and connects to an elongated base via a support element that is different from a support element that connects the primary beam to the elongated base.

11. The method of claim 10 wherein the method of creating probe structure simultaneously creates a plurality of probe structures in a batch process on a substrate over which a release layer is formed and onto which the multiple materials are deposited.

12. The method of claim 11 wherein a plurality of probe structures are attached to a second electronic component in a desired configuration and wherein the contact tips are made to at least temporarily contact a the first electronic components to provide an electrical connection between the first and the second electronic components.

13. A method of creating a probe structure for contacting a first electronic components wherein the probe structure comprises a contact tip for contacting the first electronic component and a compliant body the method comprising:
  a) forming a first part of the compliant body;
  b) forming the contact tip;
  wherein the formation of each of the compliant body and the contact tip comprise forming one or more multiple material layers of deposited material, wherein at least one of the multiple materials is at least one structural material and wherein at least another one of the multiple materials is at least one sacrificial material and wherein at least a plurality of the multiple materials are planarized to set a boundary level for each layer, and
  c) after forming the compliant and the contact tip, releasing the at least one structural material from the at least one sacrificial material to reveal the probe structure formed from the at least one structural material;
  wherein successive layers are successively formed on and adhered to previously formed layers,
  wherein the at least one structural material forming the compliant body portion of the probe structure comprises at least one material that is different from the at least one structural material forming the contact tip; and
  wherein the compliant body provides for elastic compression of the probe structure in a plane of primary motion when making contact with the first electronic component and wherein during formation of the probe structure, a stacking direction of the one or more layers forming the probe structure is perpendicular to the plane of primary motion.

14. The method of claim 13 wherein a material forming a contact portion of the contact tip is different from any material forming the compliant body.

15. The method of claim 14 wherein the probe structure comprises a cantilever probe comprising at least one feature selected from the group consisting of: a cantilever element consisting of a single cantilever beam; (2) a cantilever element comprising a plurality of cantilever beams; (3) an extended base portion that extends between a cantilever element and a surface of a second electronic component and allows for contacting a surface of the second electronic component; (4) a configuration including a primary beam and at least one additional beam that joins the primary beam and connects to an elongated base via a support element that is different from a support element that connects the primary beam to the elongated base.

16. The method of claim 13 wherein the method of creating the probe structure simultaneously creates a plurality of probe structures in a batch process on a substrate over which a release layer is formed and onto which the multiple materials are deposited.

17. The method of claim 16 wherein a plurality of probe structures are attached to a second electronic component in a desired configuration and wherein the contact tips are made to at least temporarily contact the first electronic components to provide an electrical connection between the first and the second electronic components.

18. The method of claim 13 wherein the deposited material is deposited via a process selected from the group consisting of (1) electroplating; (2) electroless plating; (3) PVD, (4) CVD, (5) sputtering, and (6) spray metal deposition.

* * * * *